US006416583B1

(12) United States Patent
Kitano et al.

(10) Patent No.: US 6,416,583 B1
(45) Date of Patent: Jul. 9, 2002

(54) FILM FORMING APPARATUS AND FILM FORMING METHOD

(75) Inventors: Takahiro Kitano, Kumamoto; Masateru Morikawa, Kamimashiki-gun; Masami Akimoto; Kazuhiro Takeshita, both of Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/328,771

(22) Filed: Jun. 9, 1999

(30) Foreign Application Priority Data

Jun. 19, 1998 (JP) ............................ 10-173229
Dec. 22, 1998 (JP) ............................ 10-364943

(51) Int. Cl.[7] ..................... B05C 11/00; B05C 11/11; B05C 5/00; B05B 15/04
(52) U.S. Cl. ..................... 118/680; 118/686; 118/58; 118/301; 118/321; 118/323; 118/504
(58) Field of Search ................. 118/504, 505, 118/301, 305, 323, 321, 677, 680, 686, 687, 57, 316, 75, 58; 427/282, 425, 424

(56) References Cited

U.S. PATENT DOCUMENTS

| 4,633,804 A | * | 1/1987 | Arii ............................ 118/52 |
| 5,059,266 A | * | 10/1991 | Yamane et al. ................ 156/64 |
| 5,578,127 A | * | 11/1996 | Kimura ....................... 118/695 |
| 5,662,785 A | * | 9/1997 | Schertler ................ 204/298.25 |
| 5,804,046 A | * | 9/1998 | Sawada et al. ........ 204/298.11 |
| 6,033,480 A | * | 3/2000 | Chen et al. .................. 118/715 |
| 6,063,190 A | * | 5/2000 | Hasebe et al. ................ 118/52 |

* cited by examiner

Primary Examiner—Richard Crispino
Assistant Examiner—Kevin P Shortsle
(74) Attorney, Agent, or Firm—Fulbright & Jaworski L.L.P.

(57) ABSTRACT

A film forming apparatus comprising a substrate holding section for holding a substrate to be processed, a nozzle unit arranged and opposing the substrate holding section, having a discharge hole for continuously applying film-forming solution, in the form of a slender stream, to a surface of a substrate held by the substrate holding section, and a drive mechanism for driving the substrate and the nozzle unit relative to each other, thereby to coat the surface of the substrate with the solution, while the nozzle unit is applying the solution, in the form of a slender stream, to the surface of the substrate.

22 Claims, 13 Drawing Sheets

FILM FORMING APPARATUS AND FILM FORMING METHOD

BACKGROUND OF THE INVENTION

The present invention relates to a film forming apparatus which applies a solution having resin or the like dissolved in it, particularly a resist solution, onto a substrate to be processed, such as a semiconductor wafer, an LC substrate, an exposure mask, or the like.

In the process of manufacturing an LCD or a semiconductor device, for example, photolithography technique is employed to form minute circuit patterns.

In the photolithography technique, resist solution is applied to the surface of a substrate to be processed, such as an LCD substrate, a semiconductor wafer, or the like, thereby forming a film thereon. Thereafter, the film is light-exposed to a specific pattern. Further, the film is subjected to developing and etching, to have a specific circuit pattern.

At present, the spin coating method is most popular as a method of applying resist solution to a substrate to be process and forming a film thereon. In the spin coating method, the resist solution is dripped onto the center part of the substrate, and the substrate is rotated at high speed. The resist solution is thereby spread over the entire surface of the substrate by virtue of centrifugal force. As a result, a resist solution film, which is substantially uniform, can be is formed all over the surface of the substrate.

In recent years, there is the trend that circuit patterns to be formed by photolithography technique have smaller and small wire width. It is therefore strongly demanded that the resist film be made thin. Namely, since the wire width of the circuit to be formed is proportional to the thickness of the resist film and the wavelength of exposure light, it is desirable to make the resist film as thin as is possible.

With the spin coating method it is possible to reduce the thickness of the resist film, by increasing the rotation speed of the substrate. Thus, an 8-inch wafer, for example, is rotated at a considerably high speed of 2000 to 4000 rpm.

The resist applying method, which uses the conventional spin coating method, has the following problems that should be solved.

(1) In the spin coating method, if the substrate to be processed is large, its the circumferential speed is high, causing a turbulent flow of air. The turbulent flow may vary the thickness of the resist film. Due to this, the exposure resolution will be decreased.

The decrease in exposure resolution is a fatal obstruction to an intended increase in the integration density of semiconductor devices. Inevitably, with the conventional spin coating method it is difficult to obtain a uniform resist film having a thickness of 0.4 $\mu$m or less. Hence, there is limitation to the manufacture of semiconductor devices of about several gigabytes.

(2) In the spin coating method, the solvent contained in the resist solution gradually evaporates as the resist solution spreads from the center part of the substrate toward the peripheral part thereof. Therefore, the viscosity of the resist solution changes in the direction the solution spreads. Those parts of the resist film, which lie on the center and peripheral parts, respectively, may differ in terms of thickness.

(3) In the spin coating method, the resist solution is wasted in a large amount, spinning off from the peripheral part of the wafer, because the substrate to be processed is rotated at high speed. In one instance, only 10% or less of the resist solution applied onto the wafer contributes to the forming of a resist film.

(4) Further, in the spin coating method, the wafer must be rotated in a cup in order to receive the resist solution spinning off. The resist solution sticking to the cup form particles, which may contaminate the substrate being processed. Hence, it is necessary to wash the cup frequently.

(5) Still further, the spin coating method is disadvantageous in that the resist solution may be applied also to that region of the substrate, such as the peripheral part, which does not contribute to the forming of a circuit. The resist solution applied to this part is usually removed right after the step of applying the resist solution, by a dedicated apparatus called "edge remover".

BRIEF SUMMARY OF THE INVENTION

The present invention has been made in view of the facts mentioned in the paragraphs (1) to (5). Its principal object is to provide a film forming apparatus which can greatly save the solution used to form a film and which can uniformly apply the solution to only the desired part of the substrate that is to processed.

According to the first aspect of this invention, there is provided a film forming apparatus which comprises: a substrate holding section for holding a substrate to be processed; a nozzle unit arranged and opposing the substrate holding section, having a discharge hole for continuously applying film-forming solution, in the form of a slender stream, to a surface of a substrate held by the substrate holding section; and a drive mechanism for driving the substrate and the nozzle unit relative to each other, thereby to coat the surface of the substrate with the solution, while the nozzle unit is applying the solution, in the form of a slender stream, to the surface of the substrate.

With this structure it is possible to apply solution, such as resist solution, in a manner of so-called single-stroke writing. Therefore, the use efficiency of resist solution for forming a film can be much increased. To form a thin film having a uniform thickness, it is necessary to discharge the solution at high pressure in as slender a stream as possible, while moving the nozzle unit at high speed. In this case, it is required that interruption of the solution stream be prevented effectively. To this end, it is desirable to provide an atmosphere control mechanism for maintaining a solvent atmosphere having a predetermined concentration in a space into which the nozzle unit applies the solution.

Here, the atmosphere control mechanism has a main body for accommodating the substrate to be process, a solvent channel provided in the main body for storing solvent controlled in temperature and surface level, and a top plate member provided above the main body and partitioning the space into which the nozzle unit applies the solution. In this case, the top plate member has an insertion section in which the nozzle unit is inserted.

Further, the top plate member may have heating means for heating the nozzle unit and the space into which the nozzle unit applies the solution. If so, the solvent atmosphere can be controlled better, and the viscosity of the solution can be controlled as is desired.

Preferably, the nozzle unit has a solution nozzle for applying the solution in the form of a slender stream, and a solvent nozzle for passing solvent around the solution applied from the solution nozzle.

In this case, the solvent is prevented from evaporating from the solution immediately after the solution is discharged from the nozzle unit, thus effectively the viscosity of the solution from changing. Interruption of the slender stream of the solution can thereby be avoided.

A route-speed setting section may be provided to set a speed at which the nozzle unit and the substrate are moved relative to each other and a route along which the solution is to be applied, in accordance with the amount of solution to apply, the time of applying the solution and the area to coat with the solution. Then, a film of the solution, which is thin and has a uniform thickness, can be formed on the substrate.

Various types of solution application routes can be set. For example, a zigzag route or a spiral route may be set.

To render the thickness of the solution film uniform, it is necessary to maintain the relative speed between the substrate and the nozzle at a constant value. To this end it is desired that a mask member be provided to cover the substrate, except a film-forming region thereof, and that the nozzle unit and the substrate be decelerated, returned and accelerated over the mask member and moved at a constant relative speed over the film-forming region of the substrate.

The mask member may be a plate having an opening that corresponds to the film-forming region. Alternatively, the mask member has a pair of solution receiving members and a drive mechanism for driving the solution-receiving members to control a distance between the solution receiving members.

Further, the solution may be one selected from the group consisting of resist solution, solution for forming an interlayer insulating film, solution for forming a highly conductive film, ferroelectric solution, sliver paste and the like.

According to the second aspect of the present invention, there is provided an apparatus for forming a film on a substrate to be processed, which comprises: a substrate holding section for holding the substrate, with the surface thereof turned downwards; a nozzle unit having a discharge hole for discharging the solution in a form of a slender stream, the discharging hole turned upwards and opposing the substrate held by the substrate holding section; and a drive mechanism for driving the substrate holding section and the nozzle unit relative to each other, thereby to coat the surface of the substrate with the solution, while the nozzle unit is applying the solution, in the form of a slender stream, to the surface of the substrate.

With this structure it is possible to apply solution, such as resist solution, in a manner of so-called single-stroke writing. The use efficiency of resist solution for forming a film can therefore be much increased. Since the substrate is held with that surface turned downwards and the solution is discharged upwards to coat the surface of the substrate, the substrate serves as a cover, effectively preventing solvent from evaporating form the solution, such as resist solution. As a result, Interruption of the slender stream of the solution can be avoided.

Moreover, with this structure, air can be easily expelled since the nozzle unit is arranged with its discharge hole turned upwards.

In the present invention, to form a thin film having a uniform thickness, the solution is discharged at high pressure in as slender a stream as possible, while moving the nozzle unit at high speed. Thus, it is preferred that the discharge hole of the nozzle unit have a diameter of 10 to 200 μm.

It is desirable for this apparatus to further have a reversing mechanism for turning the substrate upside down. The reversing mechanism needs to hold the substrate, without touching that surface e of the substrate on which a film will be formed.

Such a slender nozzle as the one used in the present invention has the problem that the discharge hole is easily clogged when it stops discharging resist solution. It is therefore desirable that the nozzle unit have a solvent supplying mechanism for discharge a solvent through the discharge hole of the nozzle unit.

According to the third aspect of the present invention, there is provided a method of forming a film on a surface of a substrate, comprising the steps of: holding a substrate to be processed; and driving the substrate and a nozzle unit relative to each other, while continuously applying film-f forming solution, in the form of a slender stream, to the surface of a substrate, thereby to form a film on the substrate.

With this method it is possible to apply solution, such as resist solution, in a manner of so-called single-stroke writing. The use efficiency of resist solution for forming a film can therefore be much increased.

It is desirable that this method have a step of covering the substrate, except the film-forming region, with a mask member.

Preferably, the method further comprises a n agitation step of vibrating the substrate coated with the solution, thereby to render flat a surface of a solution film formed on the substrate.

The method may comprises a step of holding the substrate, with the surface, on which a film is to be formed, turned downwards, and the substrate and a nozzle unit may be driven relative to each other, while continuously applying film-forming solution, in the form of a slender stream, to a surface of a substrate, thereby to form a film on the substrate. In this case, the method needs to include a step of turning the substrate upside down to hold the substrate with that surface turned downwards.

It is desired that the method include a step of holding the nozzle unit at a wait position, before a film is formed on the substrate, and that solvent be passed through the discharge hole of the nozzle unit, thereby to prevent clogging in the discharge hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below, with reference to the accompanying drawings.

First Embodiment

First, the first embodiment of the invention will be described with reference to FIGS. 1 to 10 and FIGS. 11A to 11D.

The film forming apparatus according to this embodiment is, for example, a resist solution applying apparatus that applies resist solution (film-forming solution) to a semiconductor wafer (substrate to be processed).

Figure 3:
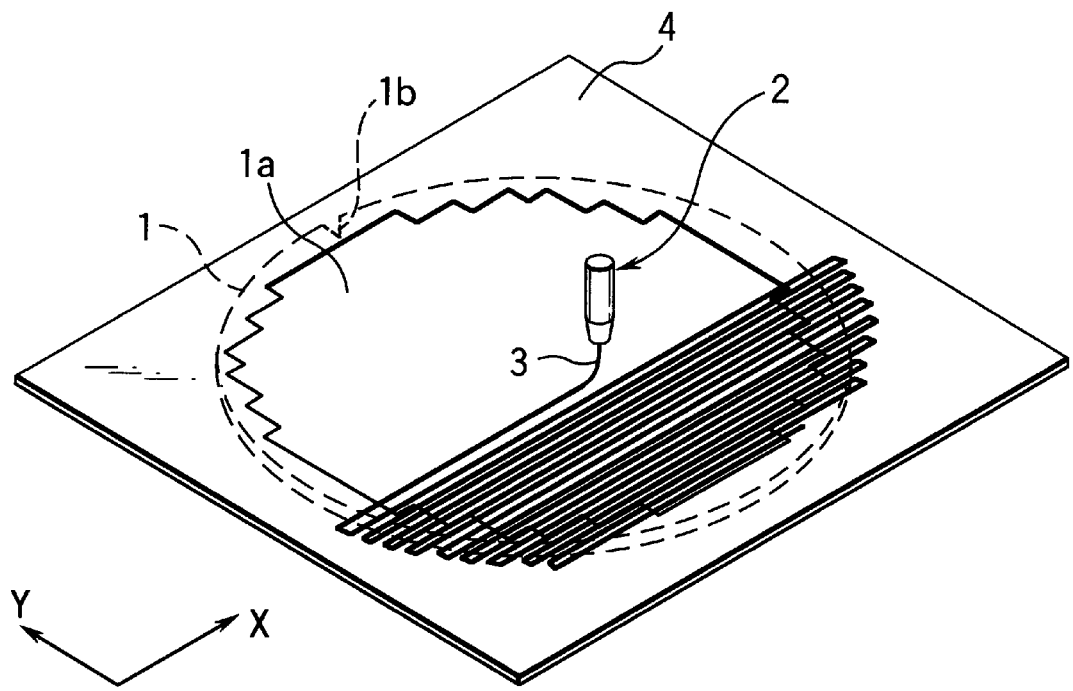
FIG. 3 is a perspective view for explaining the route along which the resist solution is applied.

The present invention is characterized in that the resist solution 3 is applied to only the circuit-forming region 1a of the wafer, in a manner of single-stroke writing, by moving a resist-solution applying nozzle unit 2 and the wafer 1 relative to each other as shown in FIG. 3. Namely, the resist solution is not applied to the wafer 1 while the wafer 1 is being rotated at high speed as in the conventional spin coating method.

In this embodiment, a mask member 4 is placed right above the wafer 1, covering the peripheral part of the wafer 1 and not covering the circuit-forming region 1a. The nozzle unit 2 is reciprocated in X direction, while intermittently moved in Y direction at a predetermined pitch. The resist solution is thereby applied to the circuit-forming region 1a only.

In this invention, various measures, which will be explained below, are taken to apply resist solution in a single-stroke writing manner in the resist solution applying apparatus applied to the photolithography technique employed in the manufacture of a semiconductor device.

(Resist Solution Applying Apparatus)

Figure 1:
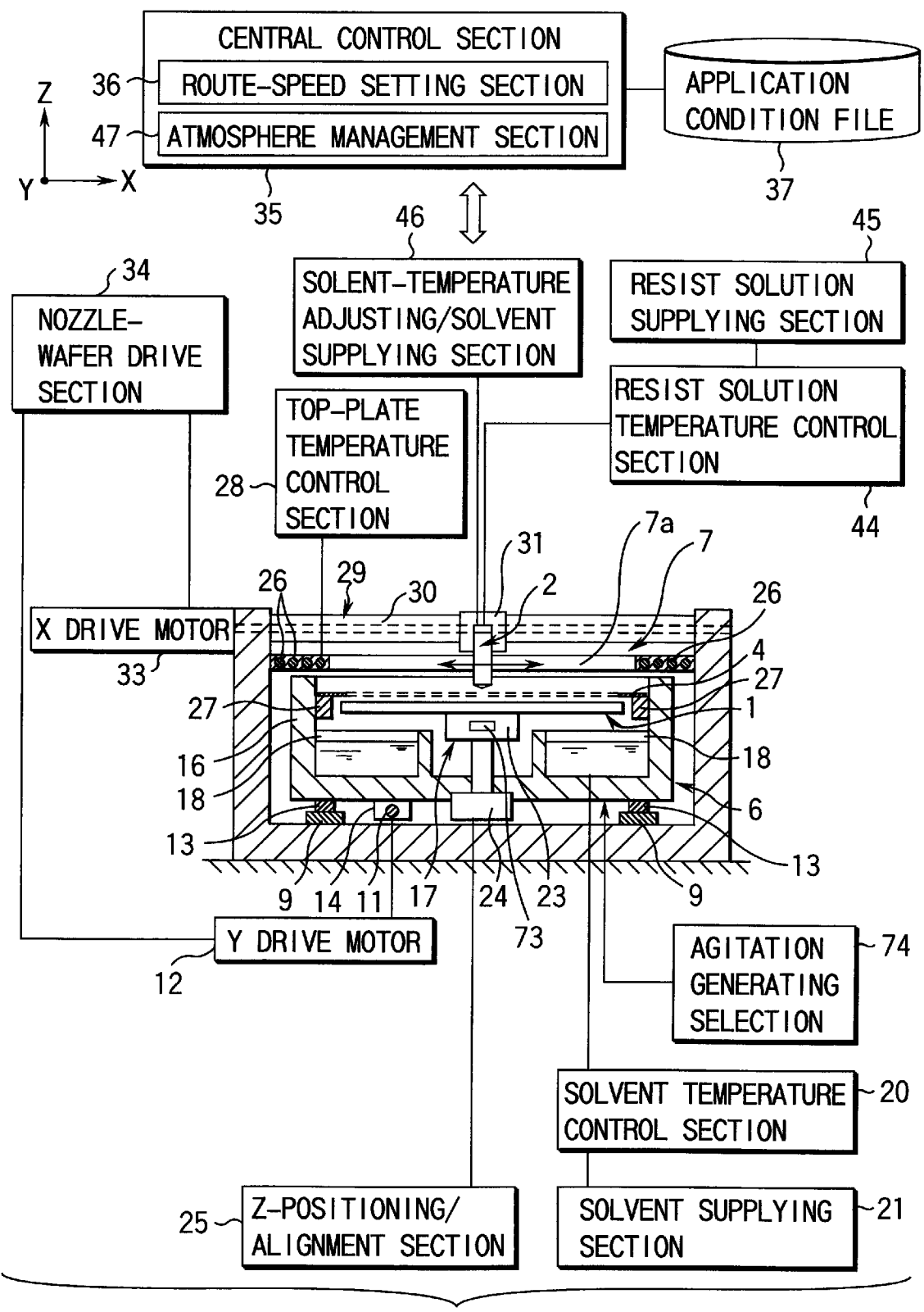
FIG. 1 is a vertical sectional view schematically showing a resist solution applying apparatus according to this invention.
Figure 2:
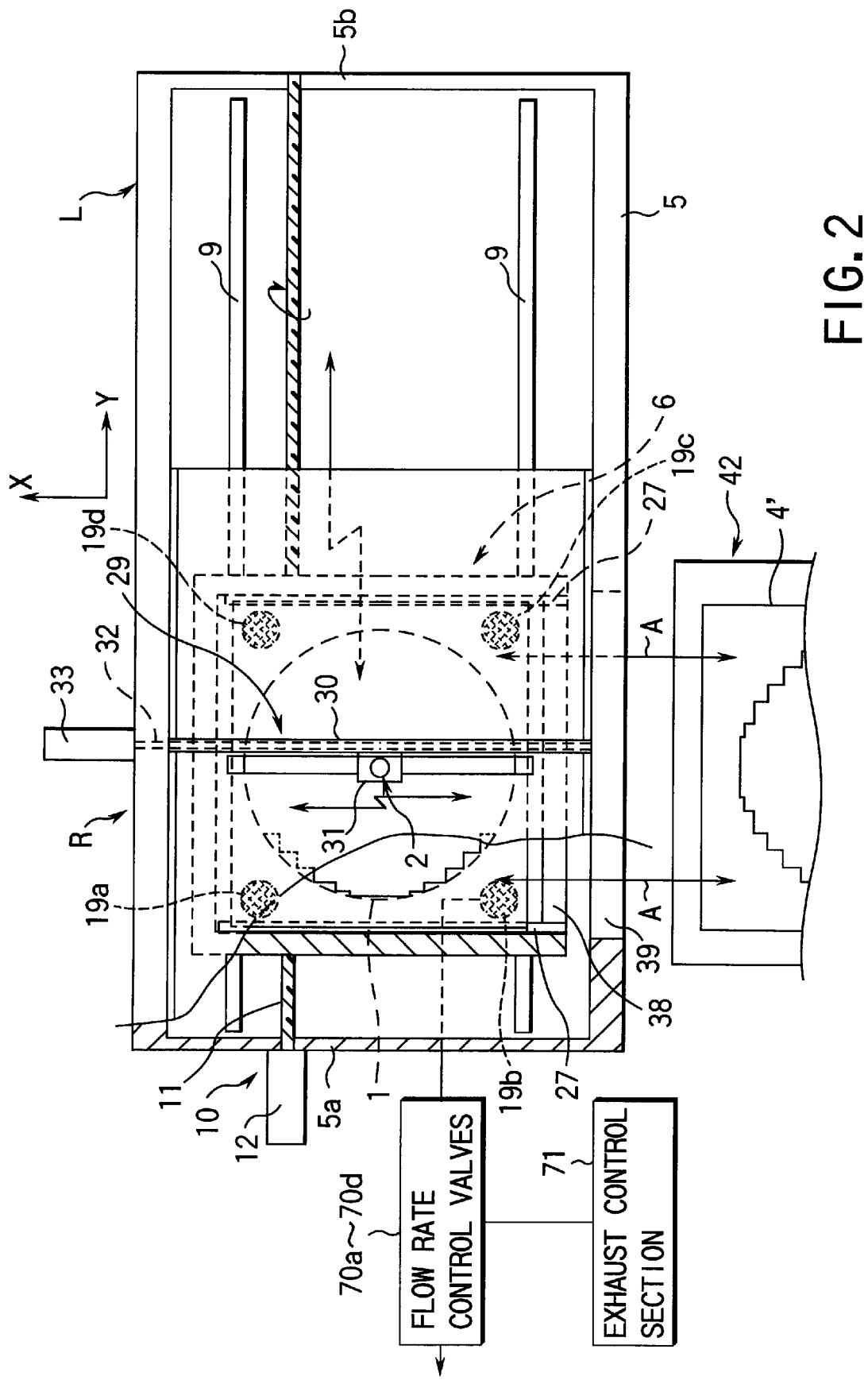
FIG. 2 is a plan view of the resist solution applying apparatus.

FIG. 1 is a vertical sectional view schematically showing this resist solution applying apparatus, and FIG. 2 is a plan view of the apparatus.

As shown in FIG. 1, the apparatus has a frame 5, a wafer holder 6 (substrate holding section of the invention) for holding the semiconductor wafer 1, a temperature-controlled top plate 7 secured to the frame 5 and covering the wafer holder 6, and the solution applying nozzle unit 2 extending through a slit 7a (insertion passage of the invention) made in the top plate 7, opposing the wafer W1 and driven in X direction with respect to the wafer 1.

The fame 5 is, for example, a channel-shaped member opening at the top, as is illustrated in FIG. 1. As shown in FIG. 2, the frame 5 is elongate, extending in the Y direction. Its one end, as viewed in the Y direction, is a resist solution applying section R, and its other end is a wafer load/unload section L. A pair of Y rails 9 extend between the resist solution applying section R and the wafer load/unload section L, for holding the wafer holder 6 and allowing the same to move in the Y direction.

Designated at numeral 10 in FIG. 2 is a ball screw mechanism for driving the wafer holder 6 in the Y direction to position the same with respect to the Y direction. The ball screw mechanism 10 has a ball screw 11 rotatably supported by the walls 5a and 5b of the frame 5, which are spaced in the Y direction, and a Y drive motor 12 for rotating the ball screw 11.

As shown in FIG. 1, the wafer holder 6 is held on the Y rails 9, by way of a slider 13, to move in the Y direction. A nut 14 is secured to the lower surface of the wafer holder 6. The ball screw 11 is set in screw engagement with the nut 14. Thus, the wafer holder 6 can be freely positioned in the Y direction when the Y drive motor 12 rotates the ball screw 11, which is set in screw engagement with the nut 14.

The wafer holder 6 has a cup-shaped main body 16 than da wafer suction table 17 for holding the wafer 1. The main body 16 has a solution channel 18, which opposes the lower surface of the wafer 1 in order to store solvent (thinner solution). The solution channel 18 is filled with the solvent, which is controlled in temperature and surface level. The solvent evaporates, maintaining the wafer 1 in a solvent atmosphere that has a predetermined concentration.

A solvent temperature control section 20 and a solvent supplying section 21 are connected to the solvent channel 18, to supply the solvent and control the temperature and surface level of the solvent. The solvent temperature control section 20 may be one that supplies temperature-controlled solvent into the solution channel 18. Alternatively, the section 20 may be one that controls a heater (heating means of the invention) provided in the main body 16 to directly control the temperature of the solvent filled in the solvent channel 18.

The solvent supplying section 21 has means for monitoring the surface level of the solvent in the solvent channel 18, such as a pressure tube. Thus, the section 21 has the function of supplying the solvent, while monitoring the surface level of the solvent. The solvent may be supplied in either replenishment scheme or circulation scheme. In the replenishment scheme, the solvent is replenished for only the amount evaporated from the solvent channel 18. In the circulation scheme, the solvent is circulated in the loop passage on which the channel 18 and the solvent supplying section 21 are provided.

In the corners of the bottom of the main body 16, which surround the wafer suction table 17 (wafer 1), four exhaust ports 19a to 19d are made to control the air flow in the main body 16. The exhaust ports 19*a* to 19*d* are connected to an exhaust device (not shown) by flow rate control valves 70*a* to 70d, respectively. The flow rate control valves 70*a* to 70d are connected to an exhaust control section 71. The exhaust control section 71 controls the flow rate control valves 70*a* to 70*d* individually. For example, the air may be exhausted through only two exhaust ports 19*a* and 19*b*, thereby causing the air to flow in a particular direction in the main body 16. The flow of the solvent evaporated from the resist solution is thereby controlled to prevent the solvent from evaporating to excess as will be described later.

The suction table 17 has a wafer holding section 23 for holding the wafer 1 on the upper surface and a Zθ drive mechanism 24 for driving the wafer holding section 23 in Zθ direction. A vacuum device (not shown) is connected to the wafer holding section 23 so that the section 23 may perform vacuum chucking of the wafer 1 placed on its upper surface. The Zθ drive mechanism 24 is connected to a z-positioning/notch-alignment section 25 as is illustrated in FIG. 1. The Z-positioning/notch-alignment section 25 actuates the Zθ drive mechanism 24 when the wafer holder 6 moves to the wafer load/unload section L, making the Zθ drive mechanism 24 perform Z-direction operation to transfer the wafer 1 and θ-operation to achieve notch alignment.

An ultrasonic vibrator 73 is secured to the wafer suction table 17, for vibrating the wafer 1 held on the table 17 by virtue of vacuum suction. The ultrasonic vibrator 73 is connected to an agitation generating section 74. The agitation generating section 74 applies vibration to the wafer 1 after the wafer 1 has been coated with the resist solution. Agitation is thereby applied to the resist solution film, rendering the surface of the film flat. The agitation works very well, particularly when the resist solution is applied in a single-stroke writing manner, because the surface of the resultant film of resist solution is not flat in most cases unlike in the spin coating method.

In the wafer holder 6, a member drive mechanism 27 is provided for holding the mask member 4 right above the wafer 1 and for driving the mask member 4 in the direction of arrow A (Y direction) to move the member 4 into and from the wafer holder 6. The mask member 4 covers the wafer 1, except the circuit-forming region la, as shown in FIG. 3, and therefore prevents the resist solution from being applied to the peripheral part of the wafer 1. The mask member drive mechanism 27 moves the mask member 4 dirty with the resist solution, to a mask washing apparatus 42 from the resist solution applying apparatus through the passages 38 and 39 made in the wafer holder 6 and frame 5, respectively, as is illustrated in FIG. 2.

The mask washing apparatus 42 has a washing mechanism (not shown) and holds a spare mask member 4'. The mask washing apparatus 42 receives the mask member 4 dirty with the resist solution, from the resist solution applying apparatus. The spare mask member 4', washed clean, is transported from the mask washing apparatus 42 to the resist solution applying apparatus. The mask member drive mechanism 27 receives the mask member 4' and positions the same with respect to the wafer 1.

As mentioned above, the temperature-controlled top plate 7 covers the wafer holder 6. As shown in FIG. 1, a linear heater 26, for example, is embedded in the top plate 7 for heating the top plate 7 to a predetermined temperature. Thus heated, the top plate 7 performs two functions.

The first function is to maintain and control the atmosphere of solvent, surrounding the wafer 1. When the resist solution is applied in a manner of so-called "single-stroke writing", it is applied in a slender stream as will be described later. The solvent contained in the solution is therefore likely to evaporate. Hence, it is required that the solvent atmosphere around the nozzle unit 2 and over the upper surface of the wafer 1 be always controlled to have a constant concentration.

The top plate 7 is heated to the predetermined temperature, thus preventing the solvent in the solvent atmosphere from coagulating. In particular, the solvent is prevented from condensing into drops on the lower surface of the top plate 7. This is how the top plate 7 controls the concentration of the solvent atmosphere.

The second function is to heat the nozzle unit 2 so as to prevent clogging in the nozzle unit 2 and interruption of the resist solution stream. As will be explained later in detail, the nozzle unit 2 needs to apply the resist solution in a slender stream and continuously, without interruption. The discharge hole of the unit 2 is much smaller than that of the resist solution nozzle of the conventional type. Clogging in the discharge hole of the nozzle unit 2 must, therefore, be prevented effectively.

The top plate 7 is located near the distal end of the nozzle unit 2. Thus located, the top plate 7 heats the nozzle unit 2 and maintain the same at an appropriate temperature, thereby effectively preventing clogging in the discharge hole of the nozzle unit 2.

Thanks to the first function, a prescribed atmosphere of solvent is maintained and controlled around the nozzle unit 2. As a result, the solvent is effectively prevented from evaporating immediately after the resist solution has been applied, thus avoiding clogging in the discharge hole and also maintaining the resist solution at a constant viscosity. Interruption of the resist solution stream is thereby prevented.

As shown in FIG. 2, the top plate 7 is provided above the resist solution applying section R only and covers the wafer holder 6. The top plate 7 needs to have such a size as to cover the wafer holder 6 even if the wafer holder 6 is moved the longest distance in the Y direction to coat the wafer 1 with the resist solution.

As indicated above, the slit 7*a* is made in the top plate 7, extending in the X direction, for allowing the nozzle unit 2 to move in the Y direction. The slit 7*a* has a length corresponding to the diameter of the wafer 1 and has a width large enough to allow passage of the nozzle unit 2.

The linear heater 26 embedded in the top plate 7 is connected to a top-plate temperature control section 28. The control section 28 controls the linear heater 26.

As shown in FIG. 1, the nozzle unit 2 is held by a linear sliding mechanism 29 that stretches in the top of the frame 5 and extends in the X direction. The linear sliding mechanism 29 has an X rail 30, a slider 31 slidably mounted on the X rail 30, a ball screw 32 for driving the slider 31, and an X drive motor 33 for rotating the ball screw 32.

The nozzle unit 2 is held by the slider 31 at a position where it opposes the slit 7*a* made in the top plate 7. The lower end portion of the nozzle unit 2 extends downwards into the wafer holder 6 through the slit 7*a*. It is desired that a Z drive mechanism (not shown) that can drive the nozzle unit 2 in the Z direction be provided on the slider 31 to pulling the nozzle unit 2 out of the slit 7*a* so that the nozzle unit 2 may be regularly washed.

The X drive motor 33 for driving the nozzle unit 2 in the X direction and the Y drive motor 12 for driving the wafer 1 in the Y direction are connected to a nozzle-wafer drive section 34. The nozzle-wafer drive section 34 drives the X drive motor 33 and the Y drive motor 12 in synchronism, thereby to move the nozzle unit 2 over the wafer 1 in a prescribed route.

The nozzle-wafer drive section 34 operates in accordance with the solution application route and relative speed which have been set by the route-speed setting section 36 provided in a central control section 35. The route-speed setting section 36 determines a solution application route on the basis of the wafer size (the size of the circuit-forming region 1a), the basic pattern of solution application route, the required amount of resist solution to apply, and the like, which are stored in an application condition file 37.

The wafer sizes available are 6 inches, 8 inches, 12 inches, and the like. There are various basic patterns of solution application route, among which are a zigzag route (FIG. 3), a spiral route, and the like. The amount of resist solution to apply is determined from the desired thickness of the film and the area to coat with the resist solution. The relative speed, which is determined from the amount of solution to apply and the time of applying the solution, is very important because it is greatly related with the thickness of the film.

The route-speed setting section 36 may automatically set the conditions of applying the resist solution. Alternatively, an operator may select desired conditions and input them into the route-speed setting section 36.

The central control section 35 is a computer system for accomplishing central control of all components of the resist solution applying apparatus, including those not illustrated in FIG. 1.

Figure 4:
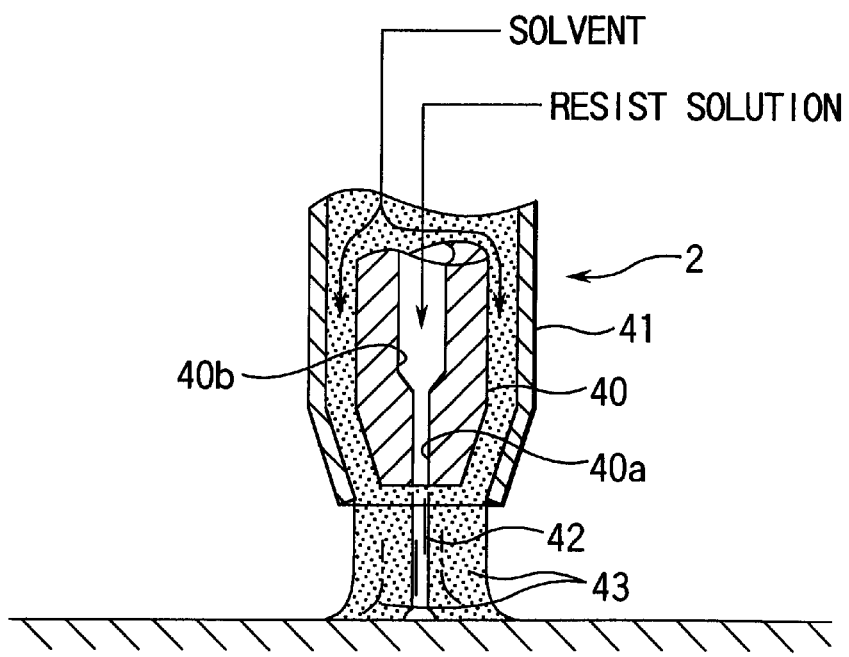
FIG. 4 is a vertical view depicting the main part of a nozzle unit.

The nozzle unit 2 has, for example, the structure shown in FIG. 4. The nozzle unit 2 has a double-pipe structure. The inner pipe is a resist solution nozzle 40 for applying the resist solution in the form of a slender stream. The outer pipe is a solvent nozzle 41 for applying a solvent in the form of mist, along the outer circumferential surface of the resist solution nozzle 40.

The resist solution nozzle 40 is made of, for example, stainless steel. Its discharge hole 40a has an extremely small diameter of 10 µm to 200 µm. The resist solution contains solvent, like those generally used in this field of art. Since the discharge hole 40a has an extremely small diameter, the ratio of its inner surface area to its volume is large. Consequently, the solvent is likely to evaporate, clogging the discharge hole 40a.

To prevent the clogging effectively, the discharge hole 40a is only long enough to form a resist solution stream having a stable diameter, and the resist solution is supplied into the hole 40a through a supplying hole 40b having a relatively large diameter of, for example, about 2 mm.

As shown in FIG. 1, the resist solution nozzle 40 is connected by a resist solution temperature control section 44 to a resist solution supplying section 45. To apply the resist solution in a single-stroke writing manner it is important to discharge the resist solution in a stream as slender as possible, without a break, while moving the nozzle unit 2 at regular pitches, so as to form a thin film having a uniform thickness.

The maximum speed of discharging the resist solution is determined by the water-head pressure of the discharge hole 40a. To discharge the resist solution under a high pressure to attain the maximum solution-discharging speed, the resist solution supplying section 45 has a positive displacement pump, such as a cylinder pump, which forces out the resist solution.

Further, the resist solution applied onto the wafer 1 spreads to some extent, depending on its viscosity. Thus, the pitch at which the nozzle unit 2 should be moved in the Y direction can be determined on the basis of the viscosity of the solution, and the solution application route is determined. Once the solution application route has been determined, the relative speed at which the nozzle unit 2 should be driven is determined from the time of applying the resist solution (obtained from the solution applying rate and the amount of solution to be discharged). In this apparatus, the relative drive speed of the nozzle unit 2 (e.g., 500 mm/s to 1 m/s) is lower than the solution-discharging speed (e.g., 2 m/s).

In the case where the nozzle unit 2 is driven while discharging the resist solution, care must be taken so that a slender stream of resist solution should not be interrupted. According to this invention, to prevent interruption of the resist solution stream, the resist solution temperature control section 44 controls the temperature of the resist solution and the top plate 7 controls this temperature even before the solution is applied. The resist solution temperature control section 44 is a water jacket that contains temperature-adjusting water heated to a prescribed temperature.

The solvent nozzle 41 is connected to a solvent-temperature adjusting/solvent supplying section 46 shown in FIG. 1. The solvent-temperature adjusting/solvent supplying section 46 controls the temperature of the solvent and supplies the solvent to the solvent nozzle 41. The solvent nozzle 41 applies the solvent, adjusted to a predetermined temperature, in the form of mist. As shown in FIG. 4, the mist of solvent envelopes the stream of resist solution that is being discharged from the resist solution nozzle 40. The evaporation of the solvent from the resist solution is thereby inhibited, maintaining the viscosity of the resist solution at a constant value and preventing interruption of the resist solution stream.

In addition, the viscosity of the resist solution applied onto the wafer 1 would not abruptly decrease since the wafer 1 remains in a constant atmosphere as described above. Thus, interruption of the resist solution stream is prevented on the wafer 1 and the spread of resist solution is promoted.

The solvent atmosphere in the wafer holder 6 is generally controlled by the evaporation of solvent from the solvent channel 18, the temperature control achieved by the top plate 7, and the discharge of solvent mist from the solvent nozzle 41. (Namely, an atmosphere control mechanism is provided according to the present invention.) This control of the solvent atmosphere is managed by an atmosphere management section 47 provided in the central control section 35.

The step of applying the resist solution, performed by this resist solution applying apparatus, will be explained next.

(1) First, a semiconductor wafer 1 is loaded into the resist solution applying apparatus. The Y drive motor 12 is driven, positioning the wafer holder 6 at the wafer load/unload section L located at the other end of the frame 5.

The wafer 1 is transferred to the wafer load/unload section L, while held by the main arm (notshown) provided for transferring wafers. The Zθ drive mechanism 24 is actuated, moving the wafer holding section 23 of the wafer suction table 17, up or down, whereby the wafer 1 is placed onto the wafer suction table 17. Then, the suction mechanism (not shown) is actuated, whereby the wafer suction table 17 holds the wafer 1 by virtue of a suction force.

Now that the wafer 1 held by virtue of a suction force, notch alignment is achieved by the Z-positioning/notch-alignment section 25. A light-emitting device and a light-receiving sensor are arranged on the frame 5, at specific positions where they oppose the peripheral part of the wafer 1. The Zθ drive mechanism 24 rotates the wafer 1. The mechanism 24 stops the wafer 1 the moment the light-receiving sensor detects the notch 1b (FIG. 3) made in the peripheral part of the wafer 1, that is, after the wafer 1 has rotated through an angle. When notch alignment is thus accomplished, the wafer holding section 23 is driven downwards, and the wafer 1 is moved into the wafer holder 6. In the wafer holder 6 the wafer 1 is locked not to rotate.

Next, the Y drive motor 12 is driven, moving the wafer holder 6 and positioning the same at the resist solution applying section R. After the wafer holder 6 has been positioned at the resist solution applying section R, the mask member drive mechanism 27 receives the mask member 4 from the mask washing apparatus 42 and holds the mask member 4 above the wafer 1.

(2) While the wafer 1 being loaded, the atmosphere management section 47 provided in the central control section 35 keeps managing the solvent atmosphere. That is, the solvent in the solvent channel 18 of the wafer holder 6 has already been controlled in temperature and surface level. Further, the top plate 7 has been heated to a prescribed temperature, thus preheating the nozzle unit 2. Still further, the solvent is discharged from the solvent nozzle 41, preventing the resist solution from drying in the discharge hole 40a of the resist solution nozzle 40 and, hence, avoiding clogging of the discharge hole 40a.

(3) When the wafer 1 is positioned at the resist solution applying section R, the central control section 35 causes the nozzle unit 2 and the wafer 1 to move relative to each other in accordance with the solution application route, relative drive speed and other conditions which have been set by the route-speed setting section 36, thereby applying the resist solution to the wafer 1.

To move the nozzle unit 2 along the route shown in FIG. 3, it is necessary to decelerate and accelerate the nozzle unit 2 at each turning point in the X direction. This may result in variation in the thickness of resist solution film. In order to avoid such variation, the nozzle unit 2 is turned back above the mask member, that is, outside the circuit-forming region 1a of the wafer 1. Thus, the nozzle unit 2 is moved at a constant speed over the entire the circuit-forming region 1a.

The film of the resist solution applied onto the wafer 1 is thereby adjusted in accordance with the diameter of the solution stream, the relative speed of the nozzle unit 2 and the spread of the resist solution on the wafer 1. As a result, a solution film having a uniform thickness is formed on the circuit-forming region 1a of the wafer 1.

At this time, the exhaust control section 71 operates, controlling the airflow around the wafer 1, thereby inhibiting the evaporation of solvent from the resist solution applied to the wafer 1. To move the nozzle unit 2 in the Y direction, for example, from the left to the right in FIG. 2, air is exhausted through only the exhaust ports 19a and 19b provided at the upstream in the Y direction, not through the other exhaust ports 19a and 19d. The solvent evaporated from the resist solution is thereby guided to the resist solution already applied to the wafer 1, whereby a solvent atmosphere covers the surface of the resist solution film. This effectively prevents the solvent from evaporating to excess from the resist solution already applied to the wafer 1.

After the application of resist solution has completed, the agitation generating section 74 actuates the ultrasonic vibrator 73 secured to the wafer suction table 17. The vibrator 73 vibrates the wafer 1 at a frequency of the ultrasonic frequency band. The resist solution applied to the wafer 1 is thereby agitated, whereby the surface of the solution film become flat.

(4) Upon completion of the above-mentioned sequence of operations, the mask member 4 got dirty with the resist solution is ejected into the mask washing apparatus 42. Then, the wafer holder 6 is moved away from the resist solution applying section R to the wafer load/unload section L. At the wafer load/unload section L, the wafer holding section 23 is moved up or down, thereby transferring the wafer 1 to the main arm (not shown).

The structure described above can be advantageous in the following respects.

First, the use efficiency of resist solution can be much increased to, in some cases, nearly 100% since the resist solution is applied in a single-stroke writing manner, without rotating the wafer 1.

In the spin coating method, generally employed as a method of applying resist solution, the resist solution is spun off in droplets from the peripheral part of the wafer, inevitably wasted in a large amount, because the wafer is rotated at high speed. In one instance, only 10% of the resist solution applied onto the wafer contributes to the formation of a resist film.

In this method, the resist solution may be applied also to the peripheral part of the wafer, in which no circuits will be formed. The resist solution applied to this region usually needs to be removed by a dedicated apparatus called "edge remover," immediately after the step of applying the resist solution.

By contrast, the resist solution need not be removed after the step of applying the resist solution in the resist solution applying apparatus according to this invention. This is because the use efficiency of resist solution is greatly increased in the apparatus according to the invention.

Second, interruption of the resist solution stream can be prevented, making it possible to form a film of solution that is thin and uniform.

That is, to apply resist solution is applied in a single-stroke writing manner, it is necessary to apply the solution in the form of as slender a stream as possible and to prevent the stream of the solution from being interrupted. Further, it is probable that the stream of solution is interrupted if the solution changes in its viscosity while being discharged. It is also probable that the solution-applying nozzle is clogged. These undesired events should be prevented, too.

With this invention it is possible to control, with high precision, the concentration of the solvent atmosphere that envelops the stream of resist solution, in order to prevent interruption of the stream of resist solution. Hence, the viscosity of the stream can be maintained constant, however slender the stream is. Thus, the stream of resist solution can be prevented from being interrupted.

Particularly, the solvent can be prevented from evaporating from the resist solution and from changing in terms of viscosity even immediately after the resist solution has been discharged from the nozzle unit 2. This is because the solvent nozzle 41 provided is made integral with the nozzle unit 2. Further, interruption of the stream of resist solution can be prevented by controlling, with high precision, the concentration of the solvent atmosphere and the heating of the nozzle unit 2 by the use of the top plate 7.

Third, since the resist solution can be prevented from spinning off in droplets, forming of particles can be effectively prevented.

That is, in the spin coating method, the wafer must be rotated in a cup so that the cup may receive the resist solution spinning off in droplets from the wafer. The solution sticking to the cup form particles, which may contaminate the wafer. It is therefore necessary to wash the cup frequently.

By contrast, in the resist solution applying apparatus according to this invention, the stream of resist solution, which is applied at a time, can have a very small diameter, preventing the solution from leaving the wafer. In addition, since the wafer 1 is not rotated, the solution scarcely spins off in droplets. Such a cup as is required in the spin coating method need not be provided. Nor will it be necessary to wash such a cup.

Fourth, the mask member 4 covers the peripheral part of the wafer 1, and the nozzle unit 2 starts and stops applying the resist solution and repeatedly changes its moving direction only while it is moving above the mask member 4. Thus, the nozzle unit 2 can be moved at a constant speed, that is, neither accelerated nor decelerated while moving over the circuit-forming region 1a of the wafer 1. This helps form a resist solution film having a uniform thickness.

In this case, the mask member 4 gets dirty with the resist solution. Nevertheless, the mask member 4 can be washed since the mask washing apparatus 42 is provided beside the resist solution applying apparatus. Further, the throughput of applying the resist solution would not be reduced because the mask washing apparatus 42 moves the mask member 4', already washed, to the position above the wafer 1, at the same time it receives the mask member 4, got dirty with the solution, from that position.

Fifth, the apparatus of the invention can reliably apply the resist solution to the entire circuit-forming region 1a of the wafer 1. This renders it unnecessary to perform a pre-wetting step (i.e., applying a solvent, such as thinner, to the surface of the wafer 1 before applying the resist solution thereto). The film-forming step can be thereby simplified.

(Coating/Developing System)

Figure 5:
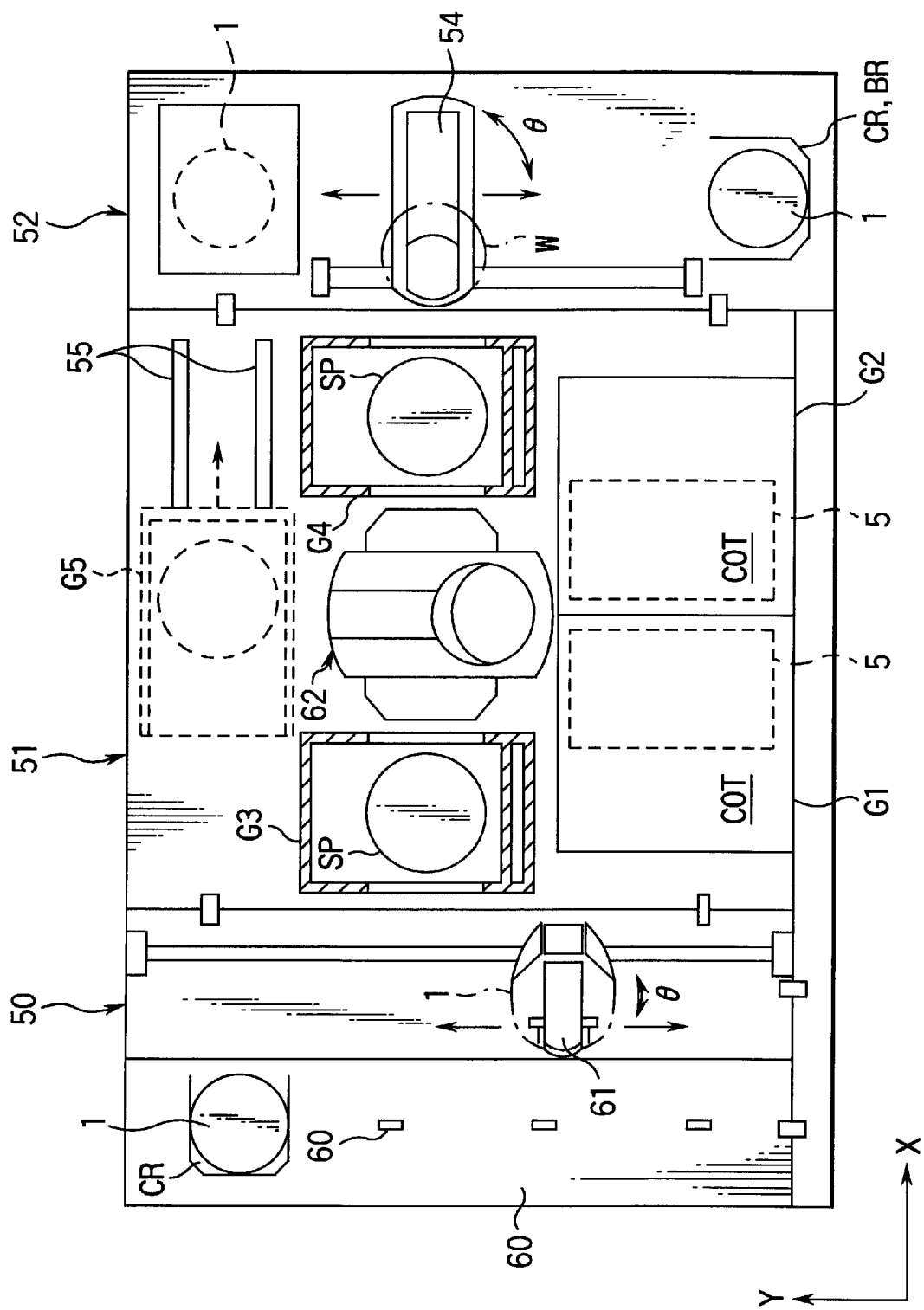
FIG. 5 is a plane view of the coating/developing system incorporating the resist solution applying apparatus according to this invention.
Figure 6:
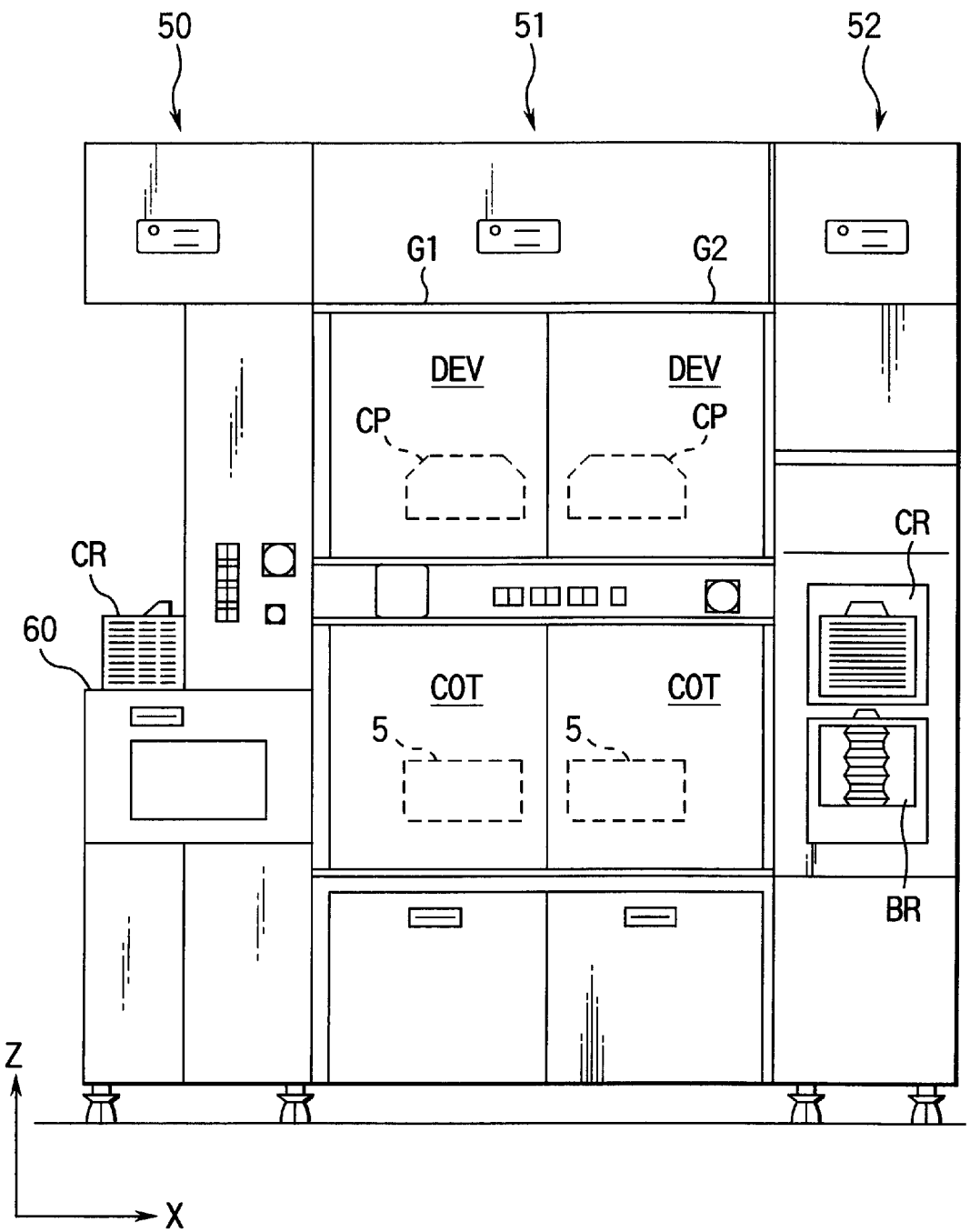
FIG. 6 is a side view of the coating/developing system.
Figure 7:
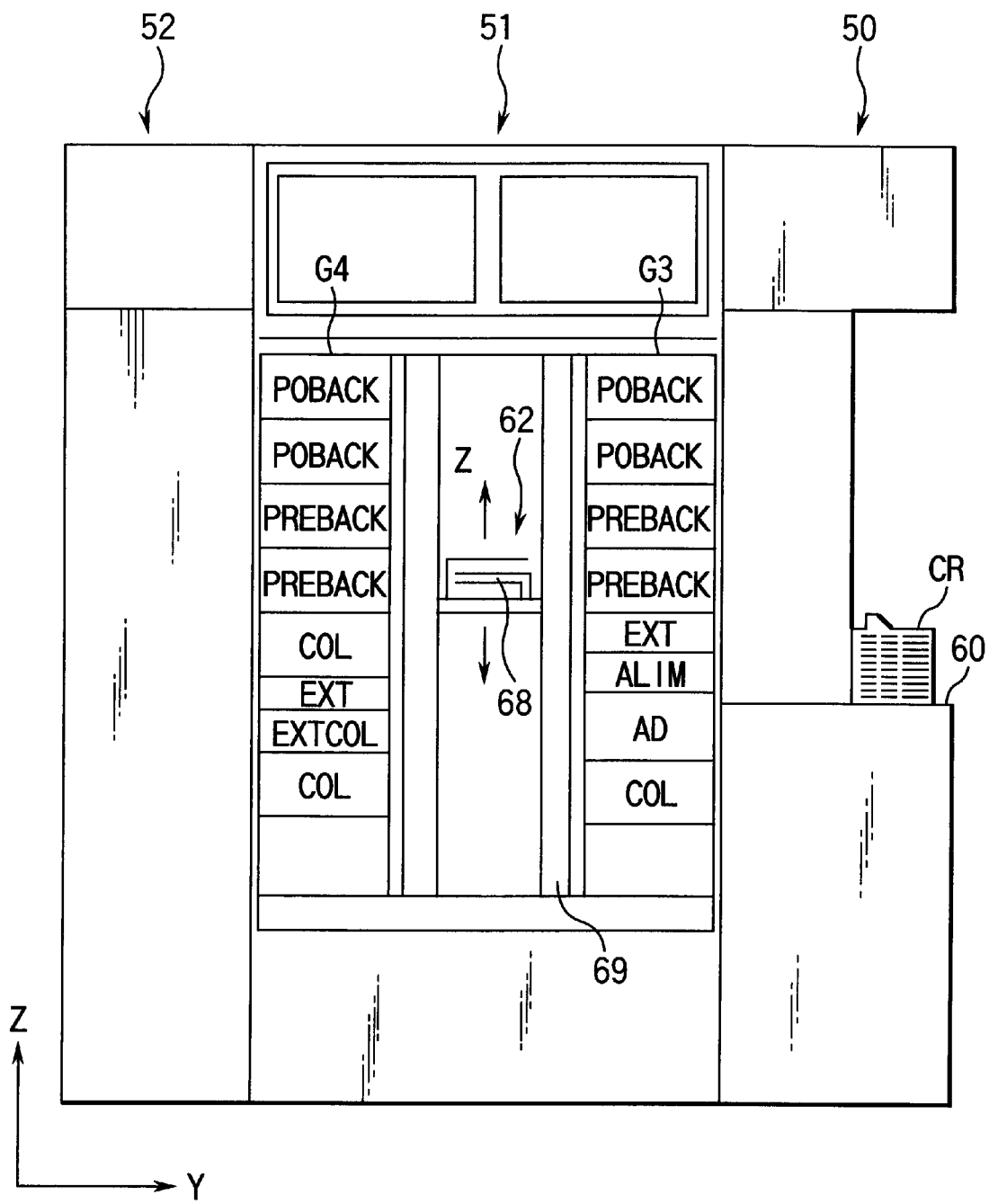
FIG. 7 is a front view of the coating/developing system, for explaining the function thereof.

It is desirable to apply this resist solution applying apparatus to the coating/developing system shown in FIGS. 5 to 7.

As shown in FIG. 5, the coating/developing system comprises a cassette section 50, a process section 51, and an interface section 52. In the cassette section 50, wafers 1 are sequentially taken from a cassette CR. In the process section 51, the resist solution is applied to a wafer 1 and the resist film formed on the wafer 1 is developed. At the interface section 52, the wafer 1 coated with the resist solution is transferred to and from an exposure apparatus (not shown).

The cassette section 50 comprises four projections 60a for positioning and holding cassettes CR and a first sub-arm mechanism 61 for taking a wafer 1 from the cassette CR held by any projection 60a. The sub-arm mechanism 61 can rotate the wafer 1 in direction, thus changing the orientation of the wafer 1 and also can transfer the wafer 1 to a main arm mechanism 62 provided in the process section 51.

Wafers 1 are transferred between the cassette section 50 and the process section 51 through the process units of a third group G3. As shown in FIG. 7, the process units of the third group G3 are arranged one upon another, forming a vertical column. More precisely, the third process unit group G3 is composed of a cooling unit (COL) for cleaning a wafer 1, an adhesion unit (AD) for rendering the wafer 1 hydrophobic to be well wetted with resist solution, an alignment unit (ALIM) for aligning the wafer 1, an extension unit (EXT) for holding the wafer 1 at a wait position, two pre-baking unit (PREBAKE) for heating the wafer 1 before exposure process, and two post-baking units (POBAKE) for heating the wafer 1 after the exposure process, which are arranged one on another in the order they are mentioned.

The wafer 1 is transferred to the main arm mechanism 62 through the extension unit (EXT) and the alignment unit (ALIM).

As shown in FIG. 5, the first to fifth process unit groups G1 to G5 of process units, including the third process unit group G3, surround the main arm mechanism 62. Like the third process unit group G3, the other process unit groups G1, G2, G4 and G5 are each composed of several units arranged one upon another.

Two resist solution applying apparatuses (COT) according to this invention are included in the first process unit group G1 and the second process unit group G2, respectively, as is illustrated in FIG. 6. Two developing apparatuses (DEV) are mounted on the resist solution applying apparatuses (COT), respectively.

As shown in FIG. 7, the main arm mechanism 62 comprises a hollow cylindrical guide 69 that extends vertically and a main arm 68 that can be driven vertically along a guide 69. The main arm 68 can also rotate in a horizontal plane and can be driven back and forth. Thus, when the main arm 68 is moved up or down, a wafer 1 can have access to any process unit provided in any one of the process unit groups G1 to G5.

The main arm mechanism 62 receives a wafer 1 from the cassette section 50 through the extension unit (EXT) of the third process unit group G3 and transports the wafer 1 into the adhesion unit (AD) of the third process unit group G3. In the adhesion unit (AD) the wafer 1 is rendered hydrophobic. Then, the mechanism 62 transports the wafer 1 from the adhesion unit (AD) into the cooling unit (COL), in which the wafer 1 is cooled.

The wafer 1, thus cooled, is made to oppose the resist applying apparatus (COT) of the first process unit group G1 (or second process unit group G2) and is moved into this resist applying apparatus (COT). The wafer 1 can be thereby loaded into the wafer load/unload section L of the resist applying apparatus according to the present invention.

In the resist applying apparatus (COT), resist solution is applied on the wafer 1 in a single-stroke writing manner as described above. The main arm mechanism unloads the wafer 1 from the wafer load/unload section L and transfers the wafer 1 to the interface section 52 through the fourth press unit group G4.

As shown in FIG. 7, the fourth process unit group G4 comprises a cooling unit (COL), an extension/cooling unit (EXT/COL), an extension unit (EXT), a cooling unit (COL), two pre-baking units (PREBAKE), and two post-backing units (POBAKE), which are arranged one upon the other in the order they are mentioned.

The wafer 1 taken from the resist applying apparatus (COT) is first inserted into the pre-baking unit (PREBAKE), in which the solvent (thinner) is evaporated from the resist solution, thus drying the wafer 1. The drying of wafer may be accomplished by, for example, vacuum drying method. That is, the wafer 1 is inserted into the pre-baking unit (PEBAKE) or a chamber other than the pre-baking unit, and the pressure therein may be reduced to remove the solvent (or to dry the resist solution).

Note that, the pre-baking unit (PREBAKE) for drying the wafer 1 may be located inside the resist applying apparatus (COT).

Next, the wafer 1 is cooled in the cooling unit (COL) and transferred via the extension unit (EXT) to a second sub-arm mechanism 54 that is provided in the interface section 52.

The second sub-arm mechanism 54 holds the wafers 1 it has received, into the cassette CR, one after another. The interface section 52 transfers the cassette CR containing the wafers 1, to the exposure apparatus (not shown), and receives the cassette CR containing the wafers 1 which have undergone the exposure process.

Each wafer 1 subjected to the exposure process is transferred via the process units of the fourth group G4 in the reverse order, to the main arm mechanism 62. The main arm mechanism 62 inserts the wafer 1, which has been exposed to light, into the post-baking unit (POBAKE), if necessary. Then, the mechanism 62 inserts the wafer 1 into the developing apparatus (DEV), in which the wafer 1 is subjected to developing process. The wafer 1, which has undergone the developing process, is transported to any baking unit, heated and dried therein, and transferred to the cassette section 50 through the extension unit (EXT) of the third process unit group G3.

The fifth process unit group G5 is selectively provided. In the present instance, it is composed in the same way as the fourth process unit group G4. The fifth process unit group G5 is movably supported on rails 55, thereby facilitating the maintenance of the first to fourth process unit groups G1 to G4.

If the film forming apparatus according to the invention is used in the coating/developing system shown in FIGS. 5 to 7, a plurality of wafers can be processed simultaneously, whereby the coating/developing step can be conducted on the wafers 1 with high efficiency. In addition, the installation area for the system can be remarkably reduced because the process units are arranged, one upon another, forming vertical columns.

The film forming apparatus according to the first embodiment can be, of course, used in systems other than the coating/developing system described above. Moreover, the film forming apparatus can be modified in various ways, within the scope of the present invention.

Figure 8:
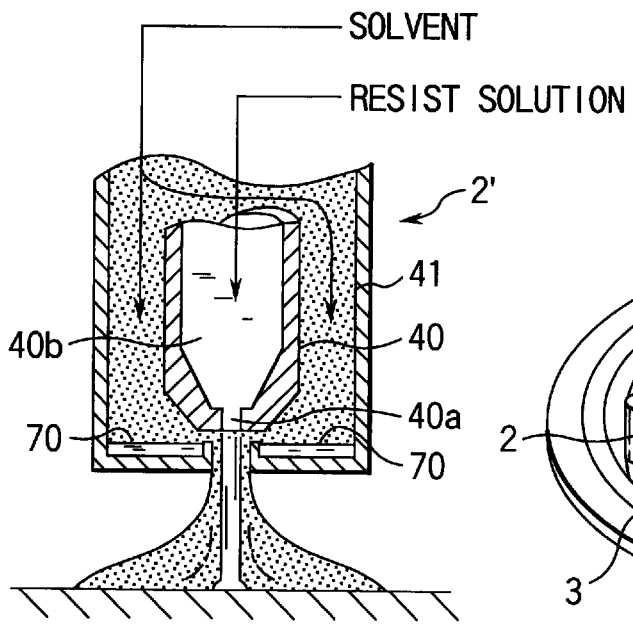
FIG. 8 is a vertical sectional view showing another type of a nozzle for use in the resist applying apparatus according to the invention.

First, the resist-solution applying nozzle unit 2 is not limited to the one illustrated in FIG. 4. Rather, the structure 2' shown in FIG. 8, for example, may be used instead. In FIG. 8, the components identical to those shown in FIG. 4 are designated at the same reference numerals.

The nozzle unit 2' is of double-pipe structure like the nozzle unit 2 of FIG. 4. The inner pipe is a resist solution nozzle 40 for applying the resist solution in the form of a slender stream, and the outer pipe is a solvent nozzle 41 for applying a solvent in the form of mist. However, a solvent pan 70 is provided at the lower end of the solvent nozzle 41, for accumulating the solvent.

This structure can not only attain the same advantages as the nozzle unit 2 of FIG. 4, but also minimize the changes in the atmosphere of solvent. In other words, the atmosphere of solvent stabilizes.

Figure 9:
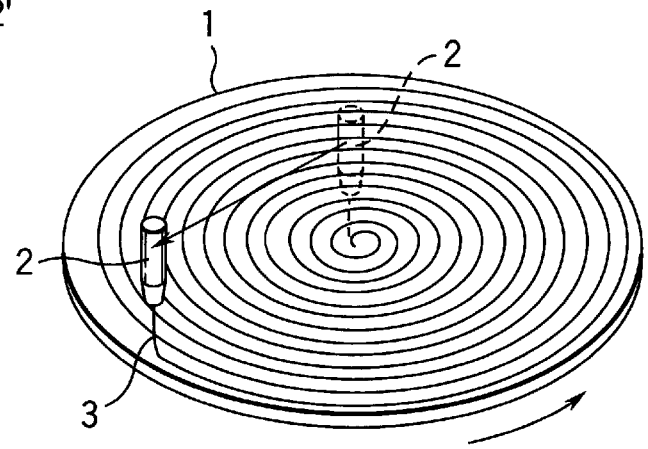
FIG. 9 is a perspective view illustrating another route along which the resist solution is applied.

Second, the solution application route is not limited to that adopted in the first embodiment (FIG. 3). Rather, it may be such a spiral one as is shown in FIG. 9. If this is the case, it is preferable that the nozzle unit 2 be moved in the radial direction of the wafer 1 (e.g., the X direction) while rotating the wafer 1 at low speed (e.g., 20 to 30 rpm).

In this case, too, it is important to maintain the speed of the wafer 1, relative to the nozzle unit 2, at a constant value. If the nozzle unit 2 is moved at a constant speed, for example, the rotation speed of the wafer 1 must be gradually lowered as the nozzle unit 2 approaches the peripheral edge of the wafer 1. On the other hand, if the wafer is rotated at a constant speed, the speed of the nozzle unit 2 must be gradually lowered as the nozzle unit 2 moves toward the peripheral edge of the wafer 1.

Figure 10:
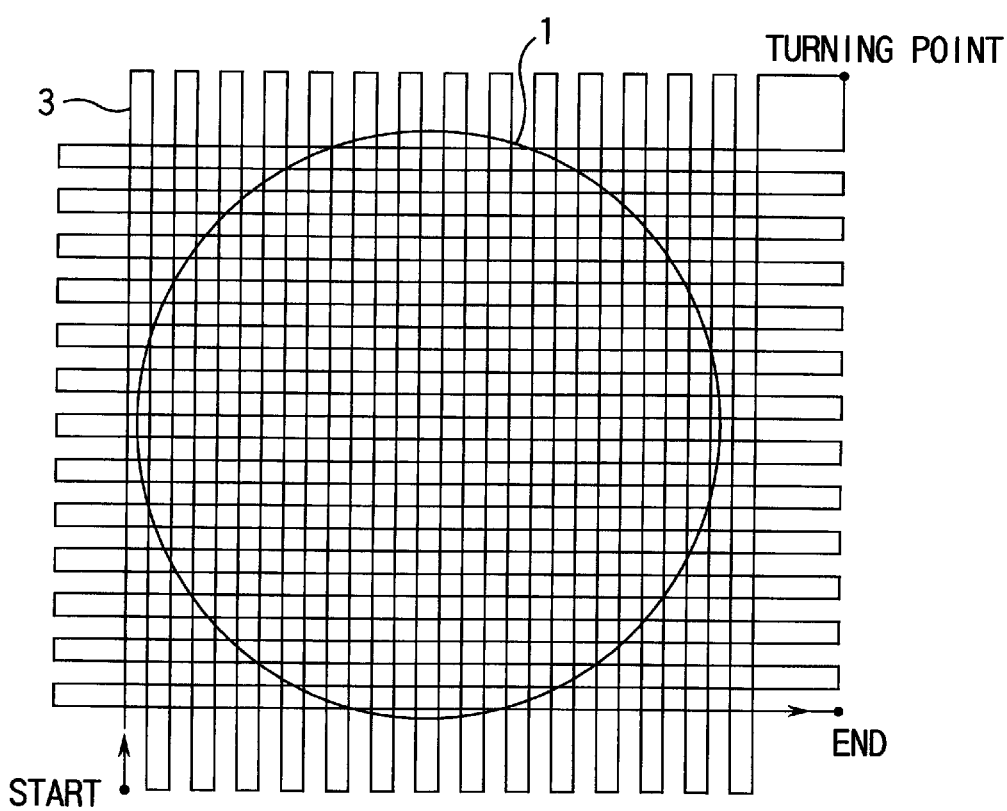
FIG. 10 is a plan view depicting still another route along which the resist solution is applied.

Third, to form a film of resist solution, which has a uniform thickness, the resist solution may be applied twice to the wafer 1, first in a first direction and then in a second direction, as is illustrated in FIG. 10. In this case, both the point START at which the application of solution is started and the point END at which the application of solution is terminated are located above the mask member 7. Thus, the nozzle unit 2 can be moved always at a constant speed over the wafer 1, thereby forming a film of resist solution that has a uniform thickness.

Fourth, in the first embodiment described above, the wafer 1 is intermittently moved in the Y direction at a certain pitch and the nozzle unit 2 is driven back and forth in the X direction. The method of moving the wafer 1 and nozzle unit 2 is not limited to this one. Instead, the wafer 1 may be moved in the X and Y directions, while the nozzle unit 2 is retained at a fixed position. In this case, the top plate 7 need not have a slit 7a, which enhances the insulation effectiveness.

Further, the actual mechanisms for driving the nozzle unit 2 and wafer holder 6 are not limited to those used in the first embodiment. Needless to say, other drive mechanisms, such as belt drive mechanisms, may be employed instead.

Fifth, any solution other than the resist solution used in the first embodiment may be applied to the wafer 1 to form a film thereon. For example, a solution for forming an interlayer insulating film, a solution for forming a highly conductive film, a ferroelectric solution, sliver paste, or the like may be applied in place of the resist solution.

Sixth, the substrate to be processed is a semiconductor wafer 1 in the embodiment described above. Nonetheless, the substrate may be an LCD substrate or an exposure mask.

Further, although one nozzle unit is used in the above-described embodiment, two or more nozzle units may be arranged side by side. If so, it is possible to shorten the time for coating the wafer 1 with the resist solution.

Seventh, the mask member 4 used in the first embodiment may not be used. In this case, it suffices to provide a container, such as a cup, below the wafer 1, to receive the residual resist solution.

Eighth, the technique of agitating the film of resist solution to impart a flat surface thereto is not limited to the method performed in the first embodiment, i.e., the use of the ultrasonic vibrator 73 secured to the wafer suction table 17.

For example, no vibrator may be used, and the wafer 1 may be moved in the Y direction by means of a ratchet mechanism, thereby to agitate the solution film formed on the wafer 1. Alternatively, any other method may be employed to agitate the solution film formed on the wafer 1.

Ninth, the mask member 4 having an opening exposing the circuit-forming region la of the wafer may be moved in the Y direction along with the nozzle unit 2, not retained immovable with respect to the wafer 1 as in the first embodiment described above.

In this case, the mask member must be one whose opening changes in size in accordance with the back-and-forth stroke of the nozzle unit 2 moving in the X direction. For instance, a mask member 80 of the structure illustrated in FIG. 11A may be employed.

Figure 11A:
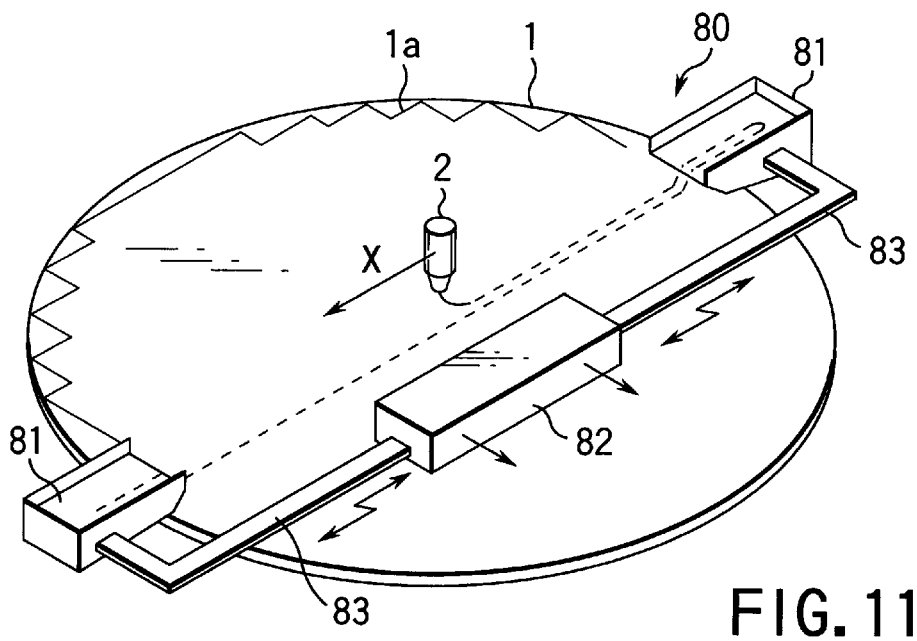
FIGS. 11A to 11D are perspective views of different mask members.

The mask member 80 shown in FIG. 11A has a pair of solution pans 81 that are spaced apart in the X direction. The solution pans 81 can be driven to change the distance between them, in accordance with the X-direction stroke of the nozzle unit 2. Thus, the pans 81 are located always at the two turning points of the nozzle unit 2, respectively.

That is, the solution pans 81 are connected to a pan-driving mechanism 82 by L-shaped arms 83. The pan-driving mechanism 82 is secured to the linear sliding mechanism 29 shown in FIG. 2 and can move in the Y direction together with the linear sliding mechanism 29. The pan-driving mechanism 82 may comprise, for example, a stepping motor and a linear gear.

The pan-driving mechanism 82 is also connected to the central control section 35 and operates in accordance with the solution application route and the relative speed, both set by the route-speed setting section 36. That is, the distance between the solution pans 81 is controlled to a value substantially equal to the X-direction stroke of the nozzle unit 2, i.e., the width of the circuit-forming region 1a.

Figure 11B:
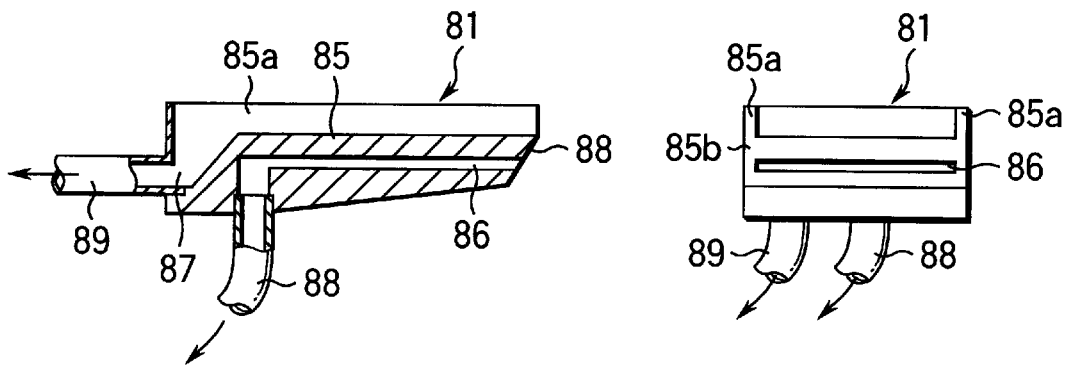
Figure 11C:
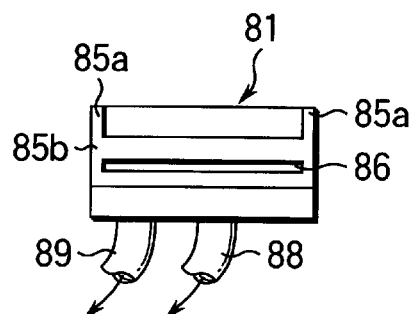
Figure 11D:
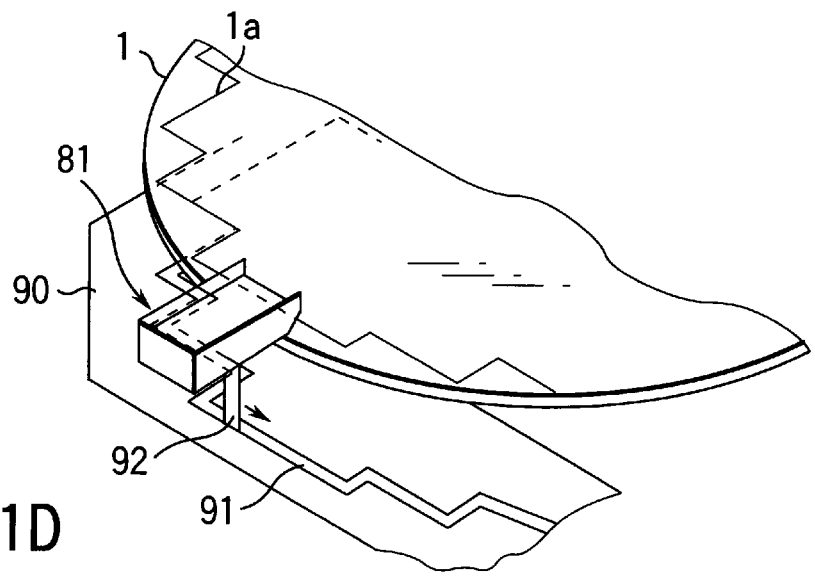

The solution pans 81 have, for example, the structure shown in FIGS. 11B and 11C. FIG. 11B is a vertical sectional view, and FIG. 11C is a front view.

Each solution pan 81 has a channel-shaped main body 85 that opens at the top. The main body has two side walls 85a, which stand from the upper surface of the main body 85 and which extend in the Y direction. The walls 85a prevent the resist solution from dripping from the long sides of the solution pan 81. No walls stand from the distal end of the main body 85. The distal end of the main body 85 is inclined downwards and toward the proximal end of the main body 85, forming an inclined surface 85b. The main body 85 has a first suction hole 86, which opens at the inclined surface 85b to draw the resist solution, which may otherwise drip along the inclined surface 85b.

The upper surface of the main body 85 is gently inclined downwards to the proximal end. The proximal end of the main body 35 has a second suction hole 87 through which the resist solution can be drawn from the upper surface of the main body 85.

The first and second suction holes 86 and 87 are connected to solution discharge tubes 88 and 89, respectively. The resist solution the solution pan 81 has received is forcedly discharged.

The solution pans 81 may be washed with solvent, such as thinner, in the frame 5 or the cup-shaped main body 16.

The mask member 80 shown in FIG. 11A is smaller than the mask member used in the first embodiment described above and can be washed within the apparatus. Hence, the mask member 80 serves to miniaturize the apparatus as a whole.

The mechanism for driving the solution pans 81 is not limited to the one depicted in FIG. 11A. For example, the distance between the pans 81 may be adjusted by using, as shown in FIG. 1D, a guide plate 90 in which two profiling cams 91 are cut. Each profiling cam 91 has the same shape as the peripheral edge of the circuit-forming region 1a of the wafer 1. The two cam followers 92 protrude downwards from the pans 81 are inserted in the profiling cams 91. The cam followers 92 are driven along the profiling cams 91, respectively, whereby the distance between the solution pans 81 is controlled.

Second Embodiment

The second embodiment of the present invention will be described, with reference to FIGS. 12 to 17. The second embodiment is a resist solution applying apparatus, which is preferably used also in the coating/developing system illustrated in FIGS. 5 to 7. The coating/developing system will not be described below since it has been described above in detail.

Figure 12:
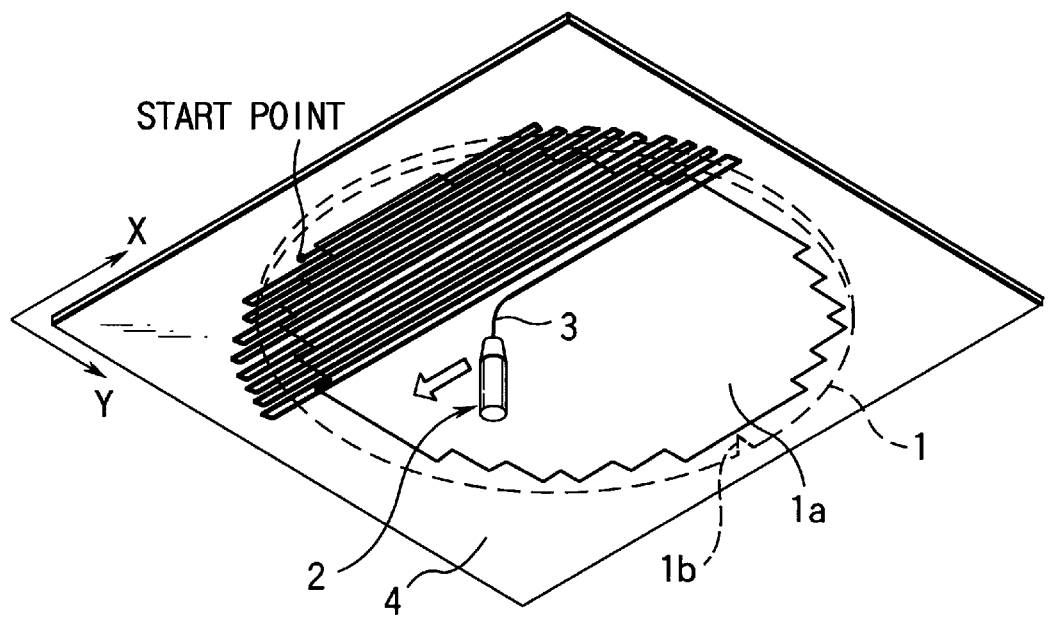
FIG. 12 is a perspective view for explaining the outline of the method of forming a film by means of the resist solution applying apparatus according to one embodiment of the invention.

The film forming apparatus according to this embodiment is the same as the first embodiment in that resist solution 3 is applied to only the circuit-forming region 1a of a wafer 1 in a so-called single-stroke writing manner as illustrated in FIG. 12.

In the second embodiment, however, the wafer 1 is turned upside down and held, with the circuit-forming region 1a facing downwards as shown in FIG. 12, and the resist solution 3 is discharged upwards from a solution applying nozzle unit 2 to coat the region 1a with the resin solution.

Also in this embodiment, a mask member 4 is arranged right below the wafer 1, covering the peripheral part of the wafer 1, not covering the circuit-forming region 1a. The solution applying nozzle unit 2 is driven back and forth in the X direction, while being intermittently moved in the Y direction at a certain pitch, thereby coating only the circuit-forming region 1a with the resist solution.

The structure of this resist applying apparatus, which is a film forming apparatus, will be described below in detail.

Figure 13A:
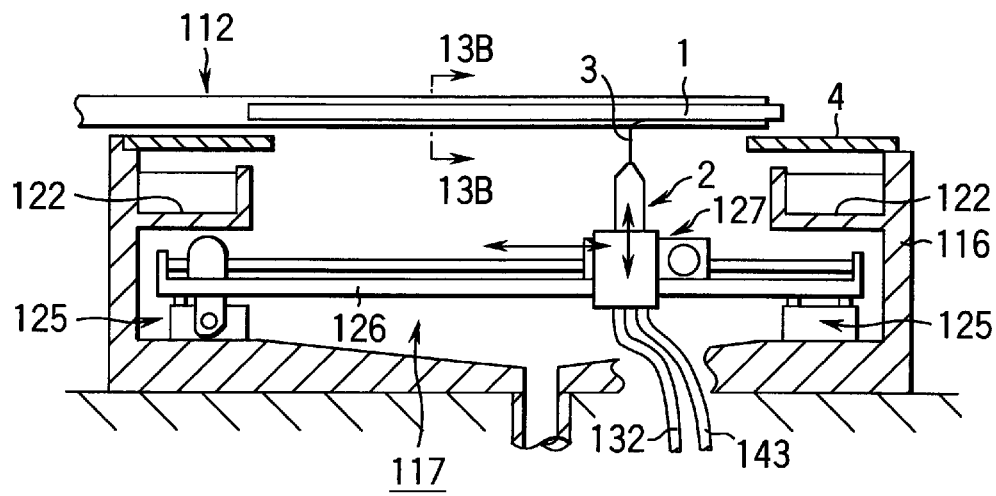
FIGS. 13A and 13B are partially sectional views showing the resist applying apparatus.
Figure 13B:
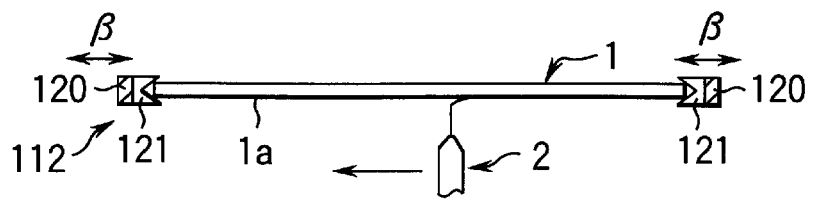
Figure 14:
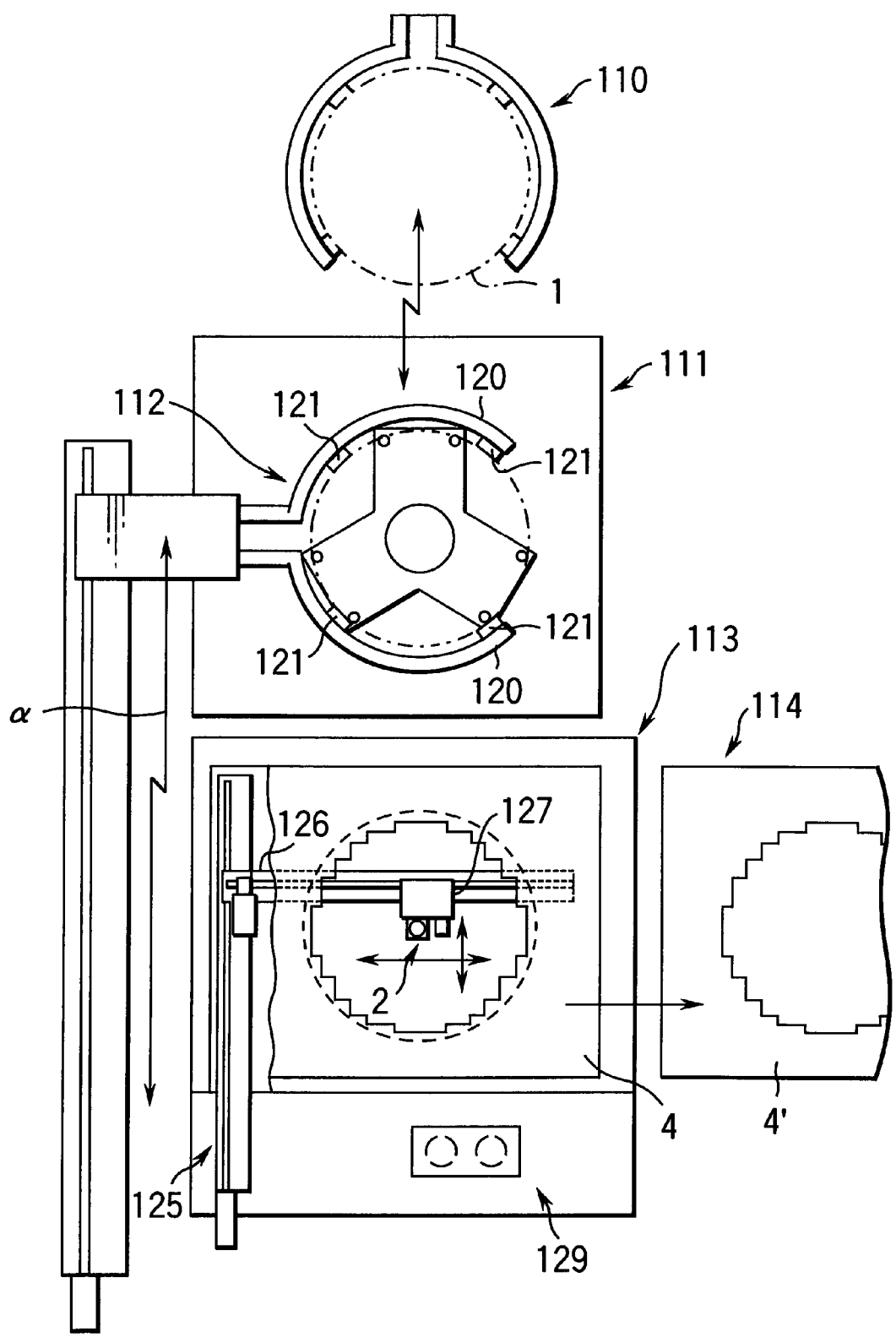
FIG. 14 is a plan view illustrating the resist applying apparatus.

FIGS. 13A and 13B are partially sectional views of the resist applying apparatus, and FIG. 14 is a plan view thereof.

As shown in FIG. 14, this apparatus has a main arm mechanism 110, a reversing mechanism 111 for turning upside down the wafer 1 transported by the main arm mechanism 110, a sub-arm mechanism 112 for receiving the wafer 1 thus turned and transport the same in the direction of arrow a, a solution applying mechanism 113 for applying resist solution to the wafer 1 transported by the sub-arm mechanism 112 and held at a predetermined position, and a mask member washing mechanism 113 for removing the mask member 4 from the resist solution applying mechanism 113 and washing the mask member 4.

As shown in FIG. 13A, the resist solution applying mechanism 113 has a frame 116 and a nozzle unit drive mechanism 117 provided in the frame 116, for driving the nozzle unit 2 in X, Y and Z directions. The nozzle unit 2 is arranged, with the discharge port turned upwards, and opposes the wafer 1 held by the sub-arm mechanism 112.

The sub-arm mechanism 112 holds the wafer 1 as is illustrated in FIG. 13B. The sub-arm mechanism 112 has a pair of arms 120 that can open and close in the direction of arrow β (FIG. 13B) and holding pads 121 secured to the inner surfaces of the arms 120, for holding the wafer 1 without touching the circuit-forming region 1a of the wafer 1. For example, four holding pads 121 are arranged along the circumference of the circle defined by the arms 120, as is illustrated in FIG. 14.

The frame 116 is shaped as shown in FIG. 13A, defining a space in which the nozzle unit 2 can move. A solvent channel 122 is provided in this space so that a solvent atmosphere may envelop the nozzle unit 2. The solvent channel 122 is filled with solvent that is controlled in temperature and surface level. The solvent evaporates, forming a solvent atmosphere having a predetermined concentration and enveloping the wafer 1. The above-mentioned mask member 4 is removably held at the top of the frame 116.

The nozzle unit drive mechanism 117 has a Y-direction drive mechanism 125 secured to the lower surface of the frame 116, an X-direction drive mechanism 126 held by the Y-direction drive mechanism 125 and able to move in the Y direction, and a Z-direction drive mechanism 127 held by the X-direction drive mechanism 126 and able to move in the Z direction. The nozzle unit 2 is attached to the Z-direction drive mechanism 127 and can be moved in the X, Y and Z directions to be positioned. The drive mechanisms 125 to 127 may be of any appropriate type. They may be ball-screw drive mechanisms or belt drive mechanisms.

As illustrated in FIG. 14, one end portion of the Y-direction drive mechanism 125 extends toward the lower end of the diagram, from the space where the resist solution is applied. The Y-direction drive mechanism 125 is designed to drive the nozzle unit 2 and position the same at a nozzle unit station 129.

Figure 15:
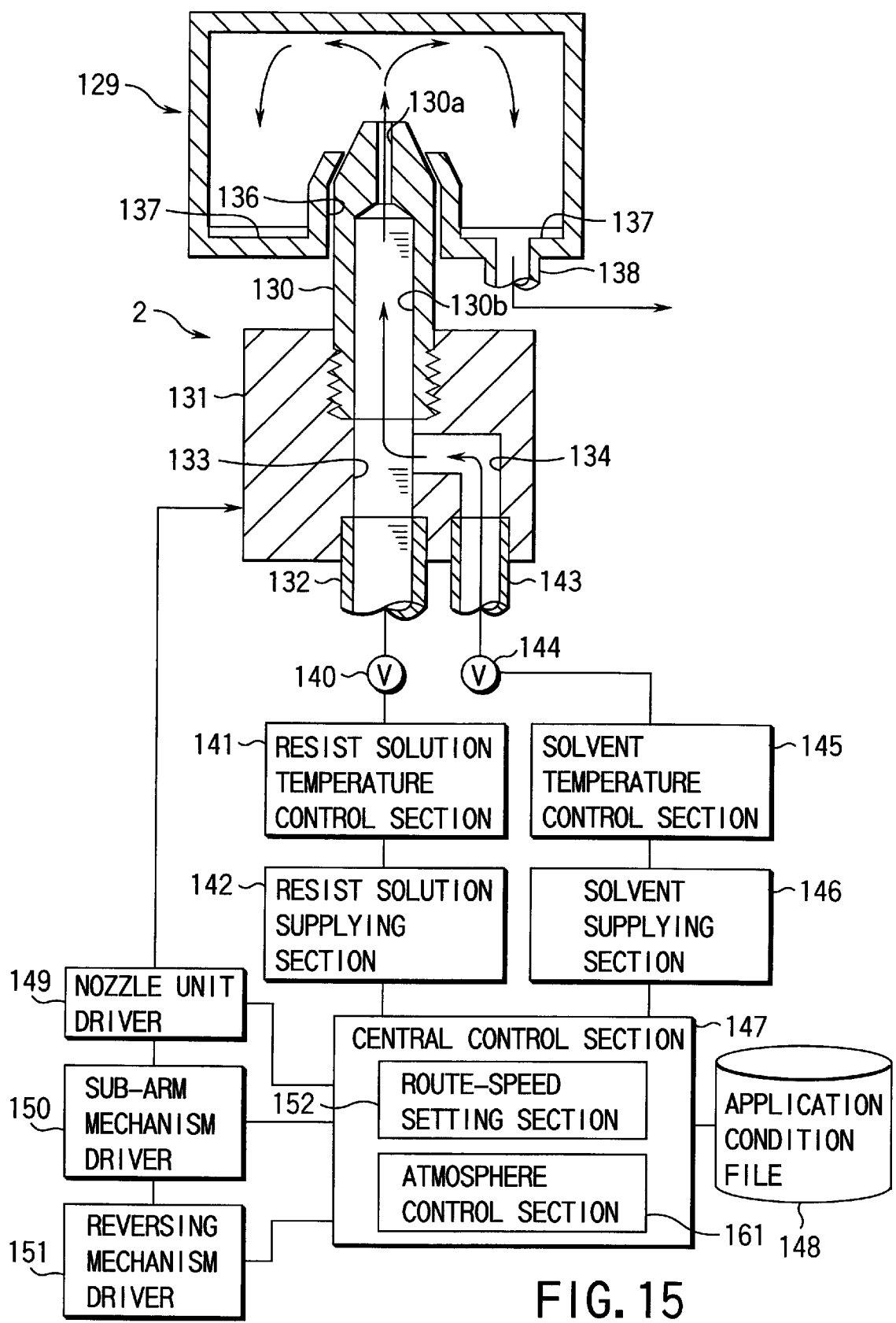
FIG. 15 is a schematic diagram showing a nozzle unit and a system configuration.

FIG. 15 shows the nozzle unit 2 held at the nozzle unit station 129. With reference to FIG. 15, the structures of the nozzle unit 2 and nozzle unit station 129 will be described.

The nozzle unit 2 comprises a nozzle 130 and a nozzle holder 131 holding the proximal end of the nozzle 130.

The nozzle 130 is made of, for example, stainless steel. Its discharge hole 130a has an extremely small diameter of 10 µm to 200 µm. The resist solution to be discharged from the hole 130a contains solvent, like those generally used in this field of art. Since the discharge hole 130a has an extremely small diameter, the ratio of its inner surface area to its volume is large. Consequently, the solvent is likely to evaporate, clogging the discharge hole 130a.

To prevent the clogging effectively, the discharge hole 130a is only long enough to form a resist solution stream having a stable diameter, and the resist solution is supplied into the hole 130a through a supplying hole 130b having a relatively large diameter of, for example, about 2 mm.

The nozzle holder 131 has a resist solution passage 133 that connects the nozzle 130 and a resist solution pipe 132. Further, the nozzle holder 131 has a solvent bypass passage 134 for supplying a solvent such as thinner into the nozzle 130.

The bypass passage 134 is opened while the nozzle unit 2 is held at the nozzle unit station 129. Thus, the solvent is continuously passed through the discharge hole 130a of the nozzle 30, thereby preventing clogging of the discharge hole 130a. The solvent discharged from the nozzle 130 evaporates in the nozzle unit station 129, forming a solvent atmosphere of a prescribed concentration, which envelops the distal end of the nozzle 130.

The nozzle unit station 129 has a nozzle insertion hole 136 into which the distal end of the nozzle 130 can be inserted. In the nozzle unit station 129 a solvent channel 137 is provided to receive the solvent discharged from the nozzle 130. The solvent accumulated in the solvent channel 137 is sequentially drained through a draining pipe 138.

Next, this resist solution applying apparatus will be described with reference to FIG. 15.

First, the resist solution pipe 132 is connected to a resist solution supplying section 142. A solution supply valve 140 and a resist solution temperature control section 141 are provided on the resist solution pipe 132.

When the resist solution is applied in a manner of single-stroke writing, it is important to discharge the solution in as slender a stream as possible and in a stable and continuous state, without break, in order to form a thin film having a uniform thickness.

The maximum speed of discharging the resist solution is determined by the water-head pressure in the discharge hole 130a. To discharge the resist solution under a high pressure to attain the maximum solution-discharging speed, the resist solution supplying section 142 has a positive displacement pump, such as a cylinder pump, which forces out the resist solution.

Further, the resist solution applied onto the wafer 1 spreads to some extent, depending on its viscosity. Thus, the pitch at which the nozzle unit 2 should be moved in the Y direction can be determined on the basis of the viscosity of the solution, and the solution application route is determined. Once the solution application route has been determined, the relative speed at which the nozzle unit 2 should be driven is determined from the time of applying the resist solution (obtained from the solution applying rate and the amount of solution to be discharged). In this apparatus, the relative drive speed of the nozzle unit 2 (e.g., 500 mm/s to 1 m/s) is lower than the solution-discharging speed (e.g., 2 m/s).

In the case where the nozzle unit 2 is driven while discharging the resist solution, the solvent may evaporate and the solution may be dried at its surface, possibly causing interruption of the solution stream. To prevent this, the resist solution is discharged to the lower surface of the wafer 1. The solvent evaporates and rises upwards. In this embodiment, the wafer 1 serves as a cover, inhibiting the evaporation of prevented, whereby interruption of the solution stream can be effectively avoided.

To prevent interruption of the resist solution stream effectively, the resist solution temperature control section 141 controls the temperature of the resist solution. The resist solution temperature control section 141 is a water jacket that contains temperature-adjusting water heated to a prescribed temperature.

The system for supplying the solvent comprises a solvent pipe 143, a solvent valve 144 connected to the bypass passage 134, a solvent temperature control section 145, and a solvent supplying section 146.

The solvent valve 144 is a passage control valve. The valve 144 is closed while the resist solution is being applied. It is opened only while no resist solution is being applied, continuously passing the solvent, which is controlled in temperature and concentration, through the discharge hole 130a of the nozzle 130.

The solution supply valve 140, resist solution temperature control section 141, resist solution supplying section 142, solvent valve 144, solvent temperature control section 145 and solvent supplying section 146 are connected to and controlled by a central control section.

The central control section 147 is the computer which controls all components of this resist solution applying apparatus, not only the components shown in FIG. 15 but also those not illustrated in FIG. 15.

A nozzle unit driver 149 for operating the nozzle unit drive mechanism 117 which comprises the X-, Y- and Z-direction drive mechanisms and the like, a sub-arm mechanism driver 150 for controlling the sub-arm mechanism 112, and a reversing mechanism driver 151 for controlling the reversing mechanism 111 are connected to the central control section 147.

The nozzle unit driver 149 operates in accordance with the solution application route and the relative speed, both set by a route-speed setting section 152 incorporated in the central control section 147. The route-speed setting section 152 has determined the solution application route on the basis of the wafer size (the size of the circuit-forming region 1a), the basic pattern of solution application route, the required amount of resist solution to apply, and the like, which are stored in an application condition file 148.

The wafer sizes available are 6 inches, 8 inches, 12 inches, and the like. There are various basic patterns of solution application route, among which is a zigzag route (FIG. 12), a spiral route, and the like. The amount of resist solution to apply is determined from the desired thickness of the film and the area to coat with the resist solution, because the use efficiency of resist solution is nearly 100% in this apparatus. The relative speed, which is determined from the amount of solution to apply and the time of applying the solution, is very important because it is greatly related with the thickness of the film.

The conditions of applying resist solution may be automatically set the conditions of applying the resist solution. Alternatively, an operator may select desired conditions and input them into the route-speed setting section 152.

The sub-arm mechanism driver 150 drives the sub-arm mechanism 112 in the direction of the arrow shown in FIG.

14, closes the arms 120 to chuck the wafer 1, and opens the arms 120 to unchuck the wafer 1.

As indicated above, the sub-arm mechanism 112 can hold the wafer 1, without touching the lower surface of the wafer 1. It receives the wafer 1 at the reversing mechanism 111, transports the wafer 1 to a position above the resist solution applying mechanism 113, and holds the wafer 1 at this position. When the wafer 1 is coated with the resist solution, sub-arm mechanism 112 takes the wafer 1 from the resist solution applying mechanism 113 and transfers the wafer 1 back to the reversing mechanism 111.

Figure 16:
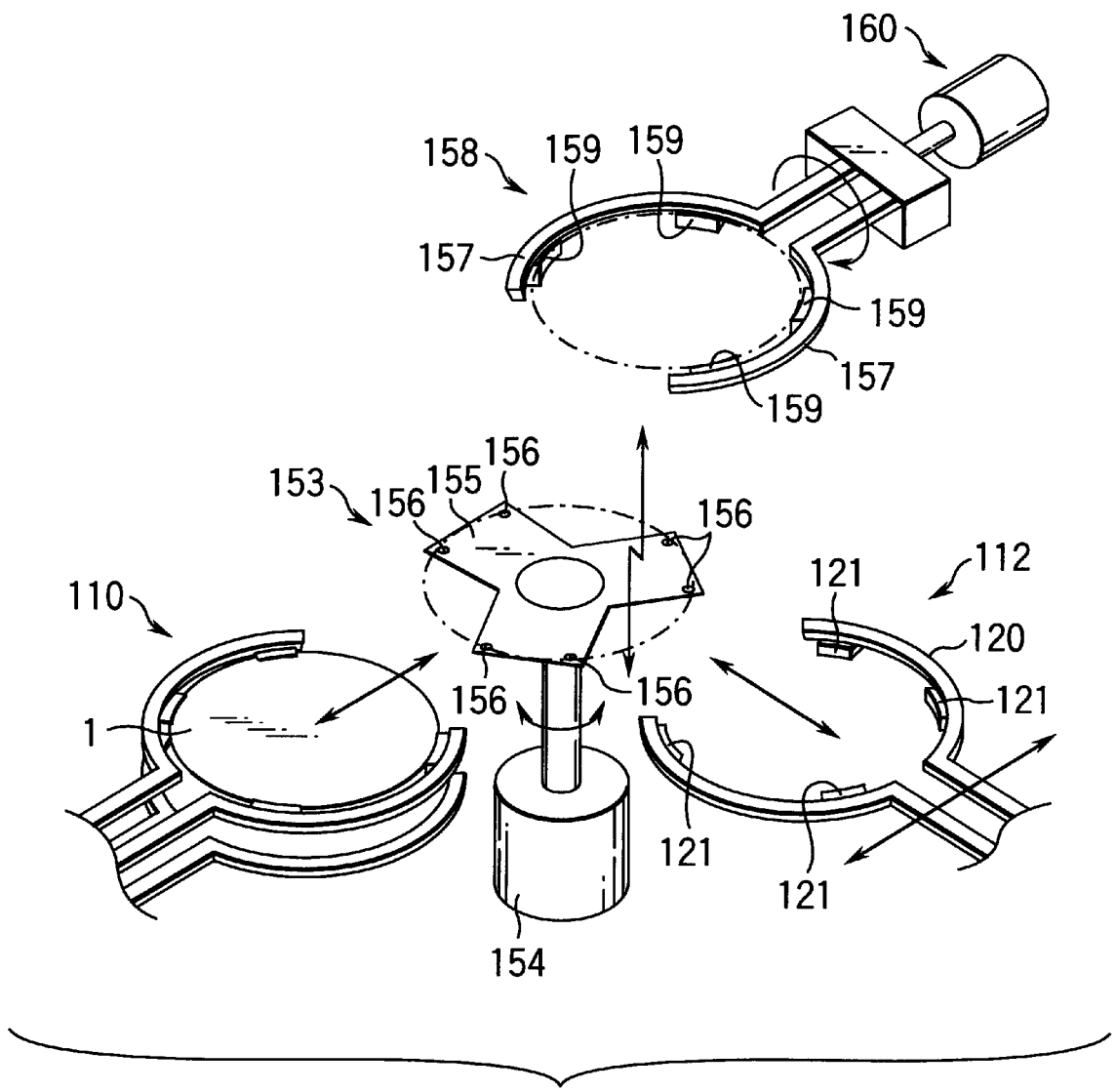
FIG. 16 is a perspective view showing a reversing mechanism.

FIG. 16 is a schematic view showing an example of the reversing mechanism 111.

This reversing mechanism 111 has a wafer holding mechanism 153. The wafer holding mechanism 153 has a Zθ drive mechanism 154 and wafer holding arms 155 connected to the Zθ drive mechanism 154. Pins 156 protrude upwards from the distal end of each wafer holding arm 155. The pins 156 can touch the peripheral part of the wafer 1, i.e., the part outside the circuit-forming region 1a of the wafer 1.

Above the wafer holding mechanism 153, a reversing arm mechanism 158 is provided for turning the wafer 1 upside down. The reversing arm mechanism 158 is similar in structure to the sub-arm mechanism 112 (FIG. 13B). It has arms 157 that can be opened and closed and holding pads 159 that can hold the wafer 1 without touching the circuit-forming region 1a thereof.

The arms 157 are held by a drive unit 160 that is designed to drive the reversing arm mechanism 158. When driven by the drive unit 160, the arms 157 turn the wafer 1 upside down, through 180°.

It will be described below how the reversing mechanism 111 operates, for example, to transfer the wafer 1 from the main arm mechanism 110 to the sub-arm mechanism 112.

First, the main arm mechanism 110 holding the wafer 1 moves toward the wafer holding mechanism 153 of the reversing mechanism 111, thus positioning the wafer 1 right above the wafer holding arms 155. Next, the wafer holding mechanism 153 moves the wafer holding arms 155 upwards, whereby the wafer 1 is placed on the upper surfaces of the arms 155.

Since the lower surface of the wafer 1 is not coated with resist solution, the wafer 1 may be held at the central part of its lower surface. Thus, the wafer 1 may be transferred from onto the wafer holding arms 155 by being first held at its center part, then elevated from the main arm mechanism 110, and finally lowered.

Next, the wafer holding arms 155 are moved up to the level where the arms 157 of the reversing arm mechanism 158. The arms 157 are closed, clamping the wafer 1 and the wafer holding arms 155 are moved downwards. Thus, the wafer 1 is transferred from the arms 157 of the reversing arm mechanism 158.

Then, the drive unit 160 of the reversing arm mechanism 158 is operated, reversing the wafer 1 upside down.

After the wafer 1 has been reversed, the wafer holding arms 155 are moved upwards again to take the wafer 1, thus reversed, from the wafer holding mechanism 153. At this time, the pins 156, which protrude from the distal end of the arms 155 hold the wafer 1.

Further, the wafer holding arms 155 are lowered to the level where the sub-arm mechanism 112 is located. Before the wafer 1 is transferred to the sub-arm mechanism 112, the Zθ drive mechanism 154 is operated, achieving the notch alignment of the wafer 1.

Upon completion of the notch alignment, the wafer 1 is transferred to the sub-arm mechanism 112. The sub-arm mechanism 112 transports the wafer 1 to the resist solution applying mechanism 113 and positions the wafer 1 right above this mechanism 113.

Having the structure described above, the reversing arm mechanism 158 can reverse the wafer 1, without touching the circuit-forming region 1a of the wafer 1.

A mask member washing mechanism 114 is provided beside the resist solution applying mechanism 113. The mechanism 114 will be described below.

As shown in FIG. 1, the mask member 4 covers all upper surface of the wafer 1, except the circuit-forming region 1a, thus preventing the peripheral part of the wafer 1 from being coated with the resist solution. Hence, the mask member 4 is inevitably got dirty with the resist solution and should be regularly washed.

The mask member 4 dirty with the resist solution is removed from the resist solution applying mechanism 113 through an insertion/ejection path (not shown) and moved into mask member washing mechanism 114.

The mask member washing mechanism 114 holds a spare mask member 4'. The mask washing mechanism 114 receives the mask member 4 dirty with the resist solution, from the resist solution applying apparatus, and transports the spare mask member 4', washed clean, to the resist solution applying apparatus. The mask member washing mechanism 114 then washes the mask member 4 got dirty.

Figure 17:
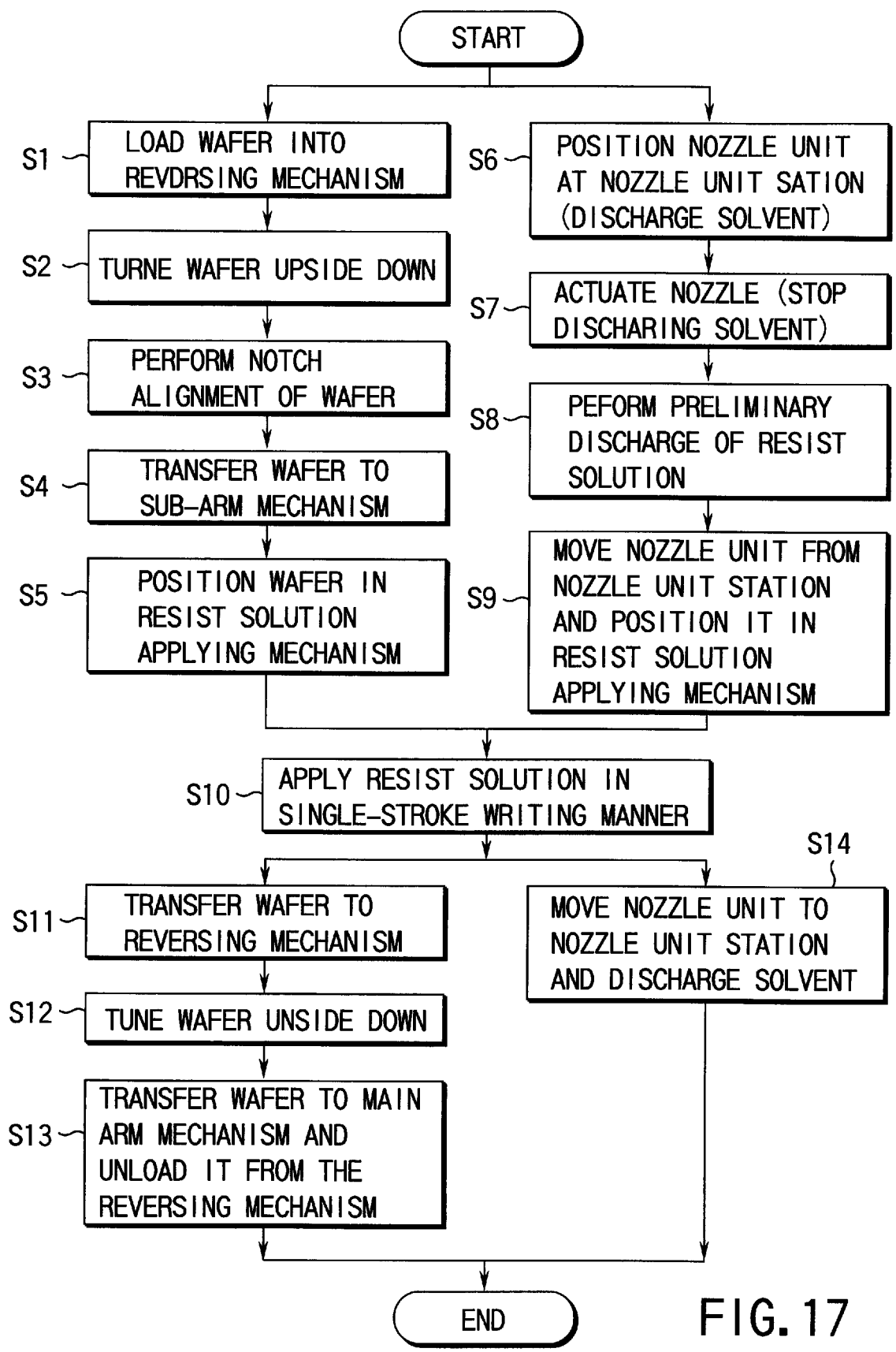
FIG. 17 is a flow chart for explaining the process of forming a film.

The step of applying the resist solution, performed by the resist solution applying apparatus, will be explained with reference to the flow chart of FIG. 17. The operations already detailed above will not be described in detail.

(1) Loading of the Wafer (Steps S1 to S5)

At first, the wafer 1 is loaded from the main arm mechanism 110 into the reversing mechanism 111 (Step S1). Then, the reversing mechanism 111 reverses the wafer 1 in the way described above (Step S2).

Next, the notch alignment of the wafer 1 is carried out before the wafer 1 is transferred to the sub-arm mechanism 112 (Step S3). That is, a light-emitting section and a light-receiving sensor are arranged at the periphery of the wafer 1, opposing each other. The Zθ drive mechanism 154 rotates the wafer 1, and the wafer 1 is stopped upon rotating through a particular angle when the notch 1b (see FIG. 1) is detected.

When the notch alignment of the wafer 1 is completed, the wafer 1 is transferred to the sub-arm mechanism 112 (Step S4). The sub-arm mechanism 112 transports the wafer 1 and holds it right above the mask member 4 which has been set in the resist solution applying mechanism 113.

(2) Actuation of the Nozzle Unit (Steps S6 to S9)

The nozzle unit 2 waits, set in the nozzle unit station 129 as shown in FIG. 4, until the wafer 1 is positioned in the resist solution applying mechanism 113 (Step S6).

At this time, the solution supply valve 140 and the solvent valve 144 are closed and opened, respectively, as mentioned above. The solvent therefore continuously passes through the small discharge hole 130a made in the nozzle 130, thus preventing the clogging and drying.

When preparation for the application of resist solution to the wafer 1 is completed, the nozzle unit 2 is actuated. More precisely, the solvent valve 144 is closed, stopping the discharging of solvent (Step S7). The solution supply valve 140 is opened, supplying the resist solution into the discharge hole 130a (Step S8). As the resist solution is supplied into the discharge hole 130a, the solution supply valve 140 is closed, and the nozzle 2 is moved from its waiting position to a position in the solution applying mechanism 113 (where the nozzle 2 oppose the point START shown in FIG. 1) (Step S9).

While the wafer 1 and the nozzle unit 2 are being loaded, the solvent atmosphere is continuously controlled in the solution applying mechanism 113. That is, the solvent in the solvent channel 122 of the solution applying mechanism 113 is kept controlled in temperature and surface level. The solvent atmosphere is controlled by an atmosphere controlling section 161 provided in the central control section 147.

(3) Application of the Resist Solution (Step S10)

When the wafer 1 is positioned in the solution applying mechanism 113, the central control section 147 moves the nozzle unit 2 and wafer 1, relative to each other, in accordance with the solution application route and relative speed set by a route-speed setting section 152 and also with other conditions. The resist solution is thereby applied to the wafer 1.

In the present embodiment, the nozzle unit 2 is driven back and forth in the X direction from the point START shown in FIG. 12, while being intermittently moved at turning points in the Y direction at a certain pitch. The wafer 1 is thereby coated with the resist solution.

To move the nozzle unit 2 along the route shown in FIG. 12, it is necessary to decelerate and accelerate the nozzle unit 2 at each turning point in the X direction. This may result in variation in the thickness of resist solution film. In order to avoid such variation, the nozzle unit 2 is turned back above the mask member, that is, outside the circuit-forming region 1a of the wafer 1. Thus, the nozzle unit 2 is moved at a constant speed over the entire the circuit-forming region 1a.

The film of the resist solution applied onto the wafer 1 is thereby adjusted in accordance with the diameter of the solution stream, the relative speed of the nozzle unit 2 and the spread of the resist solution on the wafer 1. As a result, a solution film having a uniform thickness is formed on the circuit-forming region 1a of the wafer 1.

In this embodiment, too, the evaporation of solvent is prevented by controlling the air flow during the application of resist solution and the agitation of the film of resist solution applied is performed, in the same way as in the first embodiment.

(4) Unloading of the Wafer (Steps S11 to S13)

When the application of resist solution is completed, the sub-arm mechanism 112 is moved back from the solution applying mechanism 113 and transported to the reversing mechanism 111. Then, the wafer 1 is turned upside down, in the direction reverse to the direction in which it has been turned to be loaded. The wafer 1, thus turned, is transferred to the main arm mechanism 110 (Steps S12 and S13).

The main arm mechanism 110 thereafter transports the wafer 1 to the place where the next step (baking) is carried out, and loads the next wafer 1 into the reversing mechanism 111 (Step S1 et. seq.)

(5) Holding of Nozzle at Nozzle Unit Station (Step S14)

Until the main arm mechanism 110 loads the next wafer 1, the nozzle unit 2 is held at the in the nozzle unit station 129 (Step S14). At this time, the solvent valve 144 is opened, thereby passing the solvent through the discharge hole 130a. This prevents the hole 130a from being clogged.

The structure describe above can attain not only the advantages of the first embodiment but also the following advantages.

First, interruption of the resist solution stream can be reliably prevented, to form a thin film of solution that has a uniform thickness.

That is, when the resist solution in a manner of single-stroke writing, it necessary to apply the solution in as slender a stream as possible and to prevent interruption of the solution stream in order to form a thing film of solution that has a uniform thickness. The solution stream may probably be interrupted if the viscosity of the resist solution changes during the application of the solution. Further, there is high possibility that the resist solution nozzle is clogged, and it is also necessary to prevent such clogging.

In the present invention, the wafer 1 is turned upside down, and the resist solution is discharged upwards from the nozzle unit 2, coating the wafer 1 with the solution. Thus, the solvent atmosphere in the space right below the wafer 1 can be easily maintained appropriately. The solution stream can therefore be always maintained at a constant viscosity, however slender the solution stream is. This prevents interruption of the stream of the resist solution.

That is, the solvent contained in the resist solution evaporates and flows upwards. In the ordinary coating method, the solvent easily evaporates because from the resist solution because the resist solution is applied to the upper surface of a wafer. It is therefore required that a special structure be employed to maintain the solvent atmosphere with high precision when the solution is applied in a manner of single-stroke writing as in the present invention.

By contrast, in the present invention, a solution-applying space is provided at the lower surface of the wafer 1, whereby the wafer 1 serves as a cover. Thus, an appropriate solvent atmosphere can be maintained and can prevent interruption of the stream of resist solution, without the necessity of employing a complex structure.

If the case of applying the resist solution in this manner, the spread of resist solution is more inhibited after the resist solution has been applied, than in the case where the resist solution is applied to the upper surface of the wafer. Hence, the solvent is effectively prevented from evaporating from the resist solution applied to the wafer.

As a result, the change in the viscosity of resist solution, which occurs at about the start and end of applying the solution can be reduced to a minimum. This can contribute to the enhancement of resolution.

Second, air can be easily expelled from the nozzle unit. Namely, since the discharge hole 130a of the nozzle 130 opens upwardly in the structure according to this invention, air can be automatically expelled when the nozzle is replaced with another. Neither a specific step nor a special structure is required to expel air from the nozzle.

The second embodiment is not limited to the structure described above.

First, the mechanism for preventing the clogging in the discharge hole of the nozzle unit is not limited to the one shown in FIG. 3. Any other structure may be utilized.

For example, a cover for covering the distal end of the nozzle unit may be provided, in addition to the nozzle unit station.

Second, the solution application route is not limited to the one that is illustrated in FIG. 12. Rather, it may be spiral as in the first embodiment or may be of any other type. In order to form a film of resist solution that has a uniform thickness, the resist solution may be applied twice, first in one direction and then in another.

Third, the solution used to form a film is resist solution in the apparatus of this embodiment, as in the first embodiment. Nonetheless, the solution is not limited to resist solution. Any other solution may be applied, instead. Examples of other solutions are a solution for forming an interlayer insulating film, a solution for forming a highly conductive film, a ferroelectric solution, sliver paste, and the like. Further, the substrate to be processed is not limited to a semiconductor wafer 1; instead, it may be an LCD substrate or an exposure mask.

Fourth, a mask member 4 is provided in the first embodiment. Nevertheless, this member need not be provided. If this is the case, it suffices to provide a mechanism for discharging residual resist solution, such as a cup, below the wafer 1, to receive the residual resist solution.

Moreover, the mask member may be of any one of the types shown in FIGS. 11A to 11D. If so, the apparatus can be made smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming apparatus comprising:
   a substrate holding section configured to hold a substrate to be processed, with that surface of the substrate on which a film is to be formed, turned upwards;
   a nozzle unit arranged and opposing the substrate holding section, having a discharge hole for continuously applying film forming solution, in the form of a slender stream, to a surface of the substrate held by the substrate holding section;
   a drive mechanism configured to drive the substrate and the nozzle unit relative to each other, thereby to coat the surface of the substrate with the solution, while the nozzle unit is applying the solution, in the form of a slender stream, to the surface of the substrate; and
   an atmosphere control mechanism configured to maintain a solvent atmosphere of a predetermined concentration in a space into which the nozzle unit applies the solution, wherein the atmosphere control mechanism has a main body configured to accommodate the substrate to be processed, a solvent channel provided in the main body configured to store solvent controlled in temperature and surface level, and a top plate member provided above the main body and partitioning the space into which the nozzle unit applies the solution, the top plate member has an insertion section in which the nozzle unit is inserted, and the top plate member has a heater configured to heat the nozzle unit and the space into which the nozzle unit applies the solution.

2. The apparatus according to claim 1, wherein the nozzle unit has a solution nozzle configured to apply the solution in the form of a slender stream, and a solvent nozzle configured to pass solvent around the solution applied from the solution nozzle.

3. The apparatus according to claim 1, further comprising a mask member configured to cover the substrate, except a film-forming region thereof, and to receive the solution.

4. The apparatus according to claim 3, wherein the mask member is a plate having an opening that corresponds to the film-forming region.

5. The apparatus according to claim 3, wherein the mask member has a pair of solution receiving members and a drive mechanism configured to drive the solution receiving members to control a distance between the solution receiving members.

6. The apparatus according to claim 3, wherein the mask member has a solution discharge mechanism configured to discharge the solution received.

7. The apparatus according to claim 3, further comprising a route-speed setting section configured to set a speed at which the nozzle unit and the substrate are moved relative to each other and a route along which the solution is to be applied, such that the nozzle unit and the substrate are decelerated, returned and accelerated over the mask member and moved at a constant relative speed over the film-forming region.

8. The apparatus according to claim 1, wherein the solution is one selected from the group consisting of resist solution, solution for forming an interlayer insulating film, solution for forming a highly conductive film, ferroelectric solution, and sliver paste.

9. The apparatus according to claim 2, further comprising an airflow control mechanism configured to control an airflow over that surface of the substrate which is to be coated with the solution, such that the airflow is directed toward a region of the substrate on which the solution has already been applied.

10. The apparatus according to claim 9, wherein the airflow control mechanism has an exhaust mechanism, and the exhaust mechanism is controlled to control the airflow over that surface of the substrate which is to be coated with the solution.

11. The apparatus according to claim 1, further comprising a mechanism configured to vibrate the substrate coated with the solution, thereby to render flat a surface of a solution film formed on the substrate.

12. The apparatus according to claim 1, wherein the discharge hole of the nozzle unit has a diameter of 10 to 200 $\mu$m.

13. A film forming apparatus comprising:
   a substrate holding section configured to hold a substrate to be processed;
   a nozzle unit arranged and opposing the substrate holding section, having a discharge hole for continuously applying film-forming solution, in the form of a slender stream, to a surface of the substrate held by the substrate holding section;
   a drive mechanism configured to drive the substrate and the nozzle unit relative to each other, thereby to coat the surface of the substrate with the solution, while the nozzle unit is applying the solution, in the form of a slender stream, to the surface of the substrate; and
   a mask member configured to cover the substrate, except a film-forming region thereof, and to receive the solution, the mask member having a pair of solution receiving members and a drive mechanism configured to drive the solution receiving members to control a distance between the solution receiving members.

14. The apparatus according to claim 13, wherein the nozzle unit has a solution nozzle configured to apply the solution in the form of a slender stream, and a solvent nozzle configured to pass solvent around the solution applied from the solution nozzle.

15. The apparatus according to claim 13, wherein the mask member is a plate having an opening that corresponds to the film-forming region.

16. The apparatus according to claim 13, wherein the mask member has a solution discharge mechanism configured to discharge the solution received.

17. The apparatus according to claim 13, further comprising a route-speed setting section configured to set a speed at which the nozzle unit and the substrate are moved relative to each other and a route along which the solution is to be applied, such that the nozzle unit and the substrate are decelerated, returned and accelerated over the mask member and moved at a constant relative speed over the film-forming region.

18. A film forming apparatus comprising:

a substrate holding section configured to hold a substrate to be processed, with that surface of the substrate on which a film is to be formed, turned downwards;

a nozzle unit arranged and opposing the substrate holding section, having a discharge hole for continuously applying film-forming solution, in the form of a slender stream, to a surface of the substrate held by the substrate holding section, the nozzle unit being held with the discharge hole turned upwards; and a drive mechanism configured to drive the substrate and the nozzle unit relative to each other, thereby to coat the surface of the substrate with the solution, while the nozzle unit is applying the solution, in the form of a slender stream, to the surface of the substrate.

19. The apparatus according to claim 18, further comprising a reversing mechanism configured to turn the substrate upside down to hold the substrate with the surface turned downwards.

20. The apparatus according to claim 18, wherein the nozzle unit has solvent passing means configured to pass solvent through the discharge hole of the nozzle unit when no solution is applied to form a film.

21. A film forming apparatus comprising:

a substrate holding section configured to hold a substrate to be processed, with that surface of the substrate on which a film is to be formed, turned upwards;

a nozzle unit arranged and opposing the substrate holding section, having a discharge hole for continuously applying film-forming solution, in the form of a slender stream, to a surface of the substrate held by the substrate holding section, the nozzle unit having a solution nozzle configured to apply the solution in the form of a slender stream, and a solvent nozzle configured to pass solvent around the solution applied from the solution nozzle;

a drive mechanism configured to drive the substrate and the nozzle unit relative to each other, thereby to coat the surface of the substrate with the solution, while the nozzle unit is applying the solution, in the form of a slender stream, to the surface of the substrate; and an airflow control mechanism configured to control an airflow over that surface of the substrate which is to be coated with the solution, such that the airflow is directed toward a region of the substrate on which the solution has already been applied.

22. The apparatus according to claim 21, wherein the airflow control mechanism has an exhaust mechanism, and the exhaust mechanism is controlled to control the airflow over that surface of the substrate which is to be coated with the solution.

* * * * *